US009939564B2

United States Patent
Yamamoto et al.

(10) Patent No.: US 9,939,564 B2
(45) Date of Patent: Apr. 10, 2018

(54) LIGHT-DIFFUSING MEMBER, METHOD FOR MANUFACTURING LIGHT-DIFFUSING MEMBER, AND DISPLAY DEVICE

(71) Applicant: Sharp Kabushiki Kaisha, Osaka-shi, Osaka (JP)

(72) Inventors: Emi Yamamoto, Osaka (JP); Yuhsuke Tsuda, Osaka (JP); Tsuyoshi Maeda, Osaka (JP); Yasushi Asaoka, Osaka (JP); Shohei Katsuta, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 90 days.

(21) Appl. No.: 14/767,986

(22) PCT Filed: Feb. 19, 2014

(86) PCT No.: PCT/JP2014/053895
§ 371 (c)(1),
(2) Date: Aug. 14, 2015

(87) PCT Pub. No.: WO2014/129494
PCT Pub. Date: Aug. 28, 2014

(65) Prior Publication Data
US 2015/0378069 A1    Dec. 31, 2015

(30) Foreign Application Priority Data
Feb. 22, 2013 (JP) ................... 2013-033217

(51) Int. Cl.
*G02B 5/20* (2006.01)
*F21V 9/06* (2006.01)
(Continued)

(52) U.S. Cl.
CPC ............. *G02B 5/0294* (2013.01); *B32B 7/02* (2013.01); *B32B 27/08* (2013.01); *B32B 27/20* (2013.01);
(Continued)

(58) Field of Classification Search
CPC ........... B32B 7/02; B32B 27/08; B32B 27/20; B32B 27/36; G02B 5/0278; G02B 5/0236;
(Continued)

(56) References Cited

U.S. PATENT DOCUMENTS

2002/0080484 A1\* 6/2002 Moshrefzadeh ..... G03B 21/625
359/460
2004/0151877 A1\* 8/2004 Suh ........................ B32B 27/36
428/141

(Continued)

FOREIGN PATENT DOCUMENTS

JP    2008-122843 A    5/2008
JP    2013-029827 A    2/2013

(Continued)

OTHER PUBLICATIONS

Official Communication issued in International Patent Application No. PCT/JP2014/053895, dated Apr. 1, 2014.

(Continued)

*Primary Examiner* — Mustak Choudhury
(74) *Attorney, Agent, or Firm* — Keating & Bennett, LLP

(57) ABSTRACT

This light-diffusing member includes a light-transmissive substrate, a plurality of wavelength-controlling layers formed on one surface of the light-transmissive substrate, and a light-diffusing portion formed on the one surface of the light-transmissive substrate in a region other than a region where the wavelength-controlling layers are formed. The light-diffusing portion includes a light-emitting end-surface that makes contact with the light-transmissive substrate and a light-incident end-surface that is opposite to the light-emitting end-surface and that has an area greater than an area of the light-emitting end-surface, and is made of a photosensitive resin; a height of the light-diffusing portion from the light-incident end-surface to the light-emitting end-surface is greater than a thickness of the wavelength-con- (Continued)

trolling layers; and the wavelength-controlling layers have characteristics that an optical absorptance at a first wavelength in a ultraviolet wavelength band is higher than an optical absorptance at a second wavelength in a visible-light wavelength band.

5 Claims, 24 Drawing Sheets

(51) Int. Cl.
| | |
|---|---|
| G02B 5/02 | (2006.01) |
| B32B 7/02 | (2006.01) |
| G02F 1/1335 | (2006.01) |
| B32B 27/08 | (2006.01) |
| B32B 27/20 | (2006.01) |
| B32B 27/36 | (2006.01) |
| G03F 7/00 | (2006.01) |
| G03F 7/20 | (2006.01) |
| G03F 7/32 | (2006.01) |
| G03F 7/004 | (2006.01) |
| G03F 7/038 | (2006.01) |
| G03F 7/105 | (2006.01) |

(52) U.S. Cl.
CPC ............ *B32B 27/36* (2013.01); *G02B 5/0236* (2013.01); *G02B 5/0268* (2013.01); *G02B 5/0278* (2013.01); *G02F 1/133504* (2013.01); *G03F 7/0005* (2013.01); *G03F 7/0007* (2013.01); *G03F 7/0047* (2013.01); *G03F 7/038* (2013.01); *G03F 7/105* (2013.01); *G03F 7/20* (2013.01); *G03F 7/32* (2013.01); *B32B 2307/418* (2013.01); *G02B 5/0242* (2013.01); *G02B 5/0247* (2013.01)

(58) Field of Classification Search
CPC ... G02B 5/0268; G02B 5/0294; G03F 7/0007; G03F 7/0047; G03F 7/038; G03F 7/105; G03F 7/32; G02F 1/133504
USPC ............... 359/361, 453, 456, 460, 599, 707; 252/582; 349/61; 355/67, 362, 311.01; 430/321
See application file for complete search history.

(56) References Cited

U.S. PATENT DOCUMENTS

| | | | |
|---|---|---|---|
| 2006/0001961 A1* | 1/2006 | Gibilini | ................ G03B 21/625 359/456 |
| 2009/0091824 A1* | 4/2009 | Yamashita | ........... G02B 5/0242 359/453 |
| 2014/0111862 A1 | 4/2014 | Yamamoto et al. | |

FOREIGN PATENT DOCUMENTS

| | | |
|---|---|---|
| WO | 2012/081410 A1 | 6/2012 |
| WO | 2012/157512 A1 | 11/2012 |

OTHER PUBLICATIONS

Asaoka et al., "Roll-to-Roll Fabricated Self-alignment Microstructure Film for Improving the Viewing-angle characteristics of LCD", ISSN-L, IDW '13, FMCp-31L, Dec. 2013, pp. 659-660.

Yamamoto et al., "Novel Microstructure Film for Improving Viewing Angle Characteristics of LCD", ISSN-L, IDW '13, LCT6-5L, Dec. 6, 2013, pp. 82-83.

Katsuta at al., "Optical Design of Novel Microstructure Film for Wide Viewing TN-LCD", ISSN-L, IDW '13, FMC8-5L, Dec. 6, 2013, pp. 562-563.

* cited by examiner

US 9,939,564 B2

LIGHT-DIFFUSING MEMBER, METHOD FOR MANUFACTURING LIGHT-DIFFUSING MEMBER, AND DISPLAY DEVICE

TECHNICAL FIELD

The present invention relates to light-diffusing members, methods for manufacturing light-diffusing members, and display devices.

The present application claims the priority on the basis of Japanese Patent Application No. 2013-033217 filed in Japan on Feb. 22, 2013, and the content of which is incorporated herein by reference.

BACKGROUND ART

Liquid-crystal display devices are widely used as displays for mobile electronic apparatuses including mobile phones and the like or for television sets, personal computers, and so on. In general, it is conventionally known that liquid-crystal display devices excel in viewability from the front but have a narrow viewing angle, and various contrivances are thus being made to increase the viewing angle. In one of such contrivances, a configuration in which a member for diffusing light emitted from a display unit, such as a liquid-crystal panel, (hereinafter, referred to as a light-diffusing member) is provided to the viewing side of the display unit can be considered.

For example, PTL 1 indicated below discloses a light-diffusing member that includes a light-transmissive substrate, a light-diffusing portion having a tapered reflective surface and formed on one surface of the light-transmissive substrate, and a light-shielding portion formed on the one surface of the light-transmissive substrate in a region other than a region where the light-diffusing member is formed. The light-diffusing portion is formed by patterning a transparent negative resist while being irradiated with ultraviolet radiation from the side of the light-transmissive substrate with the light-shielding portion serving as a mask.

CITATION LIST

Patent Literature

PTL 1: International Publication No. 2012/081410

SUMMARY OF INVENTION

Technical Problem

However, in the existing technique described above, some of the ultraviolet radiation passes through the light-shielding portion during patterning, and thus the light-diffusing portion cannot be formed into a desired tapered shape. Consequently, there has been a possibility that the light-diffusing property of the light-diffusing portion is reduced.

The present invention has been made in order to solve the above-described problem, and it is an object of the present invention to provide a light-diffusing member, a method for manufacturing a light-diffusing member, and a display device that can achieve favorable light-diffusing property.

Solution to Problem

In order to achieve the aforementioned object, the present invention has employed the following means.

(1) Specifically, a light-diffusing member according to one aspect of the present invention includes a light-transmissive substrate, a plurality of wavelength-controlling layers formed on one surface of the light-transmissive substrate, and a light-diffusing portion formed on the one surface of the light-transmissive substrate in a region other than a region where the wavelength-controlling layers are formed. The light-diffusing portion includes a light-emitting end-surface that makes contact with the light-transmissive substrate and a light-incident end-surface that is opposite to the light-emitting end-surface and that has an area greater than an area of the light-emitting end-surface, and is made of a photosensitive resin. A height of the light-diffusing portion from the light-incident end-surface to the light-emitting end-surface is greater than a thickness of the wavelength-controlling layers. The wavelength-controlling layers have characteristics that an optical absorptance at a first wavelength in an ultraviolet wavelength band is higher than an optical absorptance at a second wavelength in a visible-light wavelength band. The light-diffusing portion formed on the one surface of the light-transmissive substrate in a region other than the region where the wavelength-controlling layers are formed includes a light-diffusing portion formed substantially in a region other than the region where the wavelength-controlling layers are formed. "The light-diffusing portion formed substantially in a region other than the region where the wavelength-controlling layers are formed" is intended to encompass a light-diffusing portion formed so as to partially overlap the wavelength-controlling layers.

(2) In the light-diffusing member according to (1) above, the plurality of light-diffusing portions may all be formed into an identical shape or may have a variety of difference sizes. In addition, the planar shape of the light-diffusing portion may be circular, or may be an anisotropic shape having a major axis and a minor axis, a polygon, a hemisphere, or the like. In a case in which the planar shape is an anisotropic shape having a major axis and a minor axis, the ratio of the length of the minor axis to the length of the major axis may be constant, or a light-diffusing portion having a different ratio of the stated lengths may also be provided. The plurality of light-diffusing portions may be disposed such that their major axes extend in the same direction or such that the major axes of some of the plurality of light-diffusing portions extend in a direction different from the direction in which the major axes of the other light-diffusing portions extend. Alternatively, some of the light-diffusing portions may be formed so as to overlap one another, or some of the plurality of light-diffusing portions may a have shape different from the shape of the other light-diffusing portions.

(3) A light-diffusing member according to one aspect of the present invention includes a light-transmissive substrate, a plurality of light-diffusing portions formed on one surface of the light-transmissive substrate, and a wavelength-controlling layer formed on the one surface of the light-transmissive substrate in a region other than a region where the light-diffusing portions are formed. The light-diffusing portion includes a light-emitting end-surface that makes contact with the light-transmissive substrate and a light-incident end-surface that is opposite to the light-emitting end-surface and that has an area greater than an area of the light-emitting end-surface, and is made of a photosensitive resin. A height of the light-diffusing portion from the light-incident end-surface to the light-emitting end-surface is greater than a thickness of the wavelength-controlling layer. The wavelength-controlling layer has characteristics that an optical absorptance at a first wavelength in an ultraviolet wavelength band is higher than an optical absorptance at a second wavelength in a visible-light wavelength band. The wavelength-controlling layer formed on the one surface of the light-transmissive substrate in a region other than the region where the light-diffusing portions are formed includes a wavelength-controlling layer formed substantially in a region other than the region where the light-diffusing portions are formed. "The wavelength-controlling layer formed substantially in a region other than the region where the light-diffusing portions are formed" is intended to encompass a wavelength-controlling layer formed so as to partially overlap the light-diffusing portions.

(4) In the light-diffusing member according to (3) above, the plurality of wavelength-controlling layers may all be formed into an identical shape or may have a variety of different sizes. In addition, the planar shape of the wavelength-controlling layer may be circular, or may be an anisotropic shape having a major axis and a minor axis, a polygon, a hemisphere, or the like. In a case in which the planar shape is an anisotropic shape having a major axis and a minor axis, the ratio of the length of the minor axis to the length of the major axis may be constant, or a wavelength-controlling layer having a different ratio of the stated lengths may also be provided. The plurality of wavelength-controlling layers may be disposed such that their major axes extend in the same direction or such that the major axes of some of the plurality of wavelength-controlling layers extend in a direction different from the direction in which the major axes of the other wavelength-controlling layers extend. Alternatively, some of the wavelength-controlling layers may be formed so as to overlap one another, or some of the plurality of wavelength-controlling layers may have a shape different from the shape of the other wavelength-controlling layers.

(5) In the light-diffusing member according to any one of (1) to (4) above, the wavelength-controlling layer may be made of a resin material that includes an ultraviolet absorptive substance that absorbs ultraviolet radiation. The ultraviolet absorptive material may be organic or inorganic and may be of one kind or a combination of a plurality of kinds. Furthermore, the wavelength-controlling layers may be formed by stacking layers of the materials.

(6) In the light-diffusing member according to (5) above, the resin material may be colored in black. It is preferable that, in the L*a*b* color specification system, the a*b* coordinates of the material forming the wavelength-controlling layer be (0,0) and the L* coordinate be 0.

(7) In the light-diffusing member according to any one of (1) to (6) above, the angle of inclination of a side surface of the light-diffusing portion (angle formed by the light-incident end-surface and the side surface) may be identical among the light-diffusing portions, or some of the plurality of light-diffusing portions may have an angle of inclination different from the angle of inclination of another light-diffusing portion. In addition, the side surfaces of the plurality of light-diffusing portions may have a variety of angles of inclination, and the side surface of the light-diffusing portion may continuously vary. The angle of inclination of a side surface of a preferable light-diffusing portion is preferably 75° or greater and 85° or less.

(8) In the light-diffusing member according to any one of (1) to (7) above, the first wavelength band may include 365 nm, which is a photosensitive wavelength of the photosensitive resin; the second wavelength band may include 555 nm, at which photopic spectral luminous efficiency is at a maximum; and the first transmittance at the 365 nm may be no greater than one-hundredth the second transmittance at the 555 nm.

(9) A method for manufacturing a light-diffusing member according to one aspect of the present invention includes a step of forming a plurality of wavelength-controlling layers on one surface of a light-transmissive substrate; a step of forming, on the one surface of the light-transmissive substrate, a photosensitive resin layer having a light-transmitting property so as to cover the plurality of wavelength-controlling layers; a step of irradiating the photosensitive resin layer with ultraviolet radiation through the light-transmissive substrate in a region other than a region where the wavelength-controlling layers are formed, the photosensitive resin layer being irradiated on a side opposite to the one surface of the light-transmissive substrate on which the wavelength-controlling layers and the photosensitive resin layer are formed; and a step of developing the photosensitive resin layer that has been irradiated with the ultraviolet radiation, and forming, on the one surface of the light-transmissive substrate, a light-diffusing portion that includes a light-emitting end-surface that makes contact with the light-transmissive substrate and a light-incident end-surface that is opposite to the light-emitting end-surface and has an area greater than an area of the light-emitting end-surface, so as to fabricate a light-diffusing member that diffuses light incident on the light-incident end-surface of the light-diffusing portion in an azimuthal direction as viewed in a normal direction to the light-transmissive substrate. In the step of forming the wavelength-controlling layers, a resin material that includes an ultraviolet absorptive substance that absorbs ultraviolet radiation at least in a wavelength band that exposes the photosensitive resin layer is used as a material for forming the wavelength-controlling layers.

In other words, a method for manufacturing a light-diffusing member according to one aspect of the present invention includes a step of forming a plurality of wavelength-controlling layers on one surface of a light-transmissive substrate; a step of forming, on the one surface of the light-transmissive substrate, a negative resist having a light-transmitting property so as to cover the plurality of wavelength-controlling layers; a step of irradiating the negative resist with ultraviolet radiation through the light-transmissive substrate in a region other than a region where the wavelength-controlling layers are formed, the negative resist being irradiated on a side opposite to the one surface of the light-transmissive substrate on which the wavelength-controlling layers and the negative resist are formed; and a step of developing the negative resist that has been irradiated with the ultraviolet radiation, and forming, on the one surface of the light-transmissive substrate, a light-diffusing portion that includes a light-emitting end-surface that makes contact with the light-transmissive substrate and a light-incident end-surface that is opposite to the light-emitting end-surface and has an area greater than an area of the light-emitting end-surface, so as to fabricate a light-diffusing member that diffuses light incident on the light-incident end-surface of the light-diffusing portion in an azimuthal direction as viewed in a normal direction to the light-transmissive substrate. In the step of forming the wavelength-controlling layers, a resin material that includes an ultraviolet absorptive substance that absorbs ultraviolet radiation at least in a wavelength band that exposes the negative resist is used as a material for forming the wavelength-controlling layers.

(10) A method for manufacturing a light-diffusing member may include a step of forming a wavelength-controlling layer having a plurality of openings on one surface of a light-transmissive substrate; a step of forming, on the one surface of the light-transmissive substrate, a photosensitive resin layer having a light-transmitting property so as to cover the plurality of openings; a step of irradiating the photosensitive resin layer with ultraviolet radiation through the light-transmissive substrate in the openings, the photosensitive resin layer being irradiated on a side opposite to the one surface of the light-transmissive substrate on which the wavelength-controlling layers and the photosensitive resin layer are formed; and a step of developing the photosensitive resin layer that has been irradiated with the ultraviolet radiation, and forming, on the one surface of the light-transmissive substrate, a light-diffusing portion that includes a light-emitting end-surface that makes contact with the light-transmissive substrate and a light-incident end-surface that is opposite to the light-emitting end-surface and has an area greater than an area of the light-emitting end-surface, so as to fabricate a light-diffusing member that diffuses light incident on the light-incident end-surface of the light-diffusing portion in an azimuthal direction as viewed in a normal direction to the light-transmissive substrate. In the step of forming the wavelength-controlling layer, a resin material that includes an ultraviolet absorptive substance that absorbs ultraviolet radiation at least in a wavelength band that exposes the photosensitive resin layer may be used as a material for forming the wavelength-controlling layer.

In other words, a method for manufacturing a light-diffusing member may include a step of forming a wavelength-controlling layer having a plurality of openings on one surface of a light-transmissive substrate; a step of forming, on the one surface of the light-transmissive substrate, a negative resist having a light-transmitting property so as to cover the plurality of openings; a step of irradiating the negative resist with ultraviolet radiation through the light-transmissive substrate in the openings, the negative resist being irradiated on a side opposite to the one surface of the light-transmissive substrate on which the wavelength-controlling layer and the negative resist are formed; and a step of developing the negative resist that has been irradiated with the ultraviolet radiation, and forming, on the one surface of the light-transmissive substrate, a light-diffusing portion that includes a light-emitting end-surface that makes contact with the light-transmissive substrate and a light-incident end-surface that is opposite to the light-emitting end-surface and has an area greater than an area of the light-emitting end-surface, so as to fabricate a light-diffusing member that diffuses light incident on the light-incident end-surface of the light-diffusing portion in an azimuthal direction as viewed in a normal direction to the light-transmissive substrate. In the step of forming the wavelength-controlling layer, a resin material that includes an ultraviolet absorptive substance that absorbs ultraviolet radiation at least in a wavelength band that exposes the negative resist may be used as a material for forming the wavelength-controlling layer.

(11) In the method for manufacturing a light-diffusing member according to (9) or (10) above, a material that is colored in black may be used as the resin material for the wavelength-controlling layer.

(12) A display device according to one aspect of the present invention includes a display unit, and a viewing-angle-broadening member that is provided on a viewing side of the display unit and that broadens an angular distribution of light incident thereon from the display unit as compared with an angular distribution held prior to being incident on the viewing-angle-broadening member and emits resulting light. The viewing-angle-broadening member is constituted by the light-diffusing member according to (1) or (3) above; the display unit includes a plurality of pixels forming a display image; and at least part of the wavelength-controlling layer of the light-diffusing member is included in the pixels of the display unit.

(13) The display device according to (12) above may include a refractive-index-adjusting layer provided between a second polarization plate and the light-transmissive substrate, the refractive-index-adjusting layer having a refractive index that lies between a refractive index of the second polarization plate and a refractive index of the light-transmissive substrate. The refractive-index-adjusting layer may be formed of a single kind of material, or may be formed of two or more kinds of materials having different refractive indices so that the refractive index is set to have the aforementioned relationship.

(14) In a light-diffusing film of the display device according to (12) above, a scattering film may be provided on a viewing side surface of the light-transmissive substrate, and a light-scattering body may be provided in the light-transmissive substrate so as to make the light-transmissive substrate itself function as a light-scattering layer. Alternatively, a light-scattering body may be provided in a hard-coat layer (protective layer) that is provided on the viewing side surface of the light-transmissive substrate, and the hard-coat layer itself may be made to serve as a light-scattering layer. Alternatively, a scattering film may be disposed between the light-transmissive substrate and the light-diffusing portion. A light-scattering body may be provided inside the light-diffusing portion. A light-scattering body may be provided inside a bonding layer that affixes (bonds) the light-diffusing film to a liquid-crystal display unit, and the bonding layer may be made to function as a light-scattering layer. Furthermore, at least two or more among the above-described configurations may be combined.

(15) In the light-diffusing member according to (1) or (3) above, if the light-diffusing film is to be used in a liquid-crystal display device that is used in an environment where there is little influence of outside light, a wavelength-controlling layer in which an ultraviolet absorber is added to a resin material having a high light-transmitting property (without a light-shielding property) in a visible-light range may be used. Alternatively, a configuration may be such that the wavelength-controlling layer is colored in a color other than black (e.g., blue, red, yellow, etc.).

(16) The light-diffusing member according to (1) or (3) above may be used as a lighting film, a web roll for a lighting film, a window pane, a roll screen, and a lighting louver that can efficiently guide light incident on a window pane to a ceiling of a room or toward the back of a building.

Advantageous Effects of Invention

According to an aspect of the present invention, a light-diffusing member, a method for manufacturing a light-diffusing member, and a display device that can achieve favorable light-diffusing property can be provided.

DESCRIPTION OF EMBODIMENTS (First Embodiment)

Hereinafter, a first embodiment of the present invention will be described with reference to the drawings.

In the present embodiment, a liquid-crystal display device provided with a transmissive liquid-crystal panel serving as a display unit will be described as an example.

It is to be noted that some constituent elements may be illustrated on different dimension scales so that each constituent element can be easily recognized in all of the drawings, hereinafter.

Figure 1:
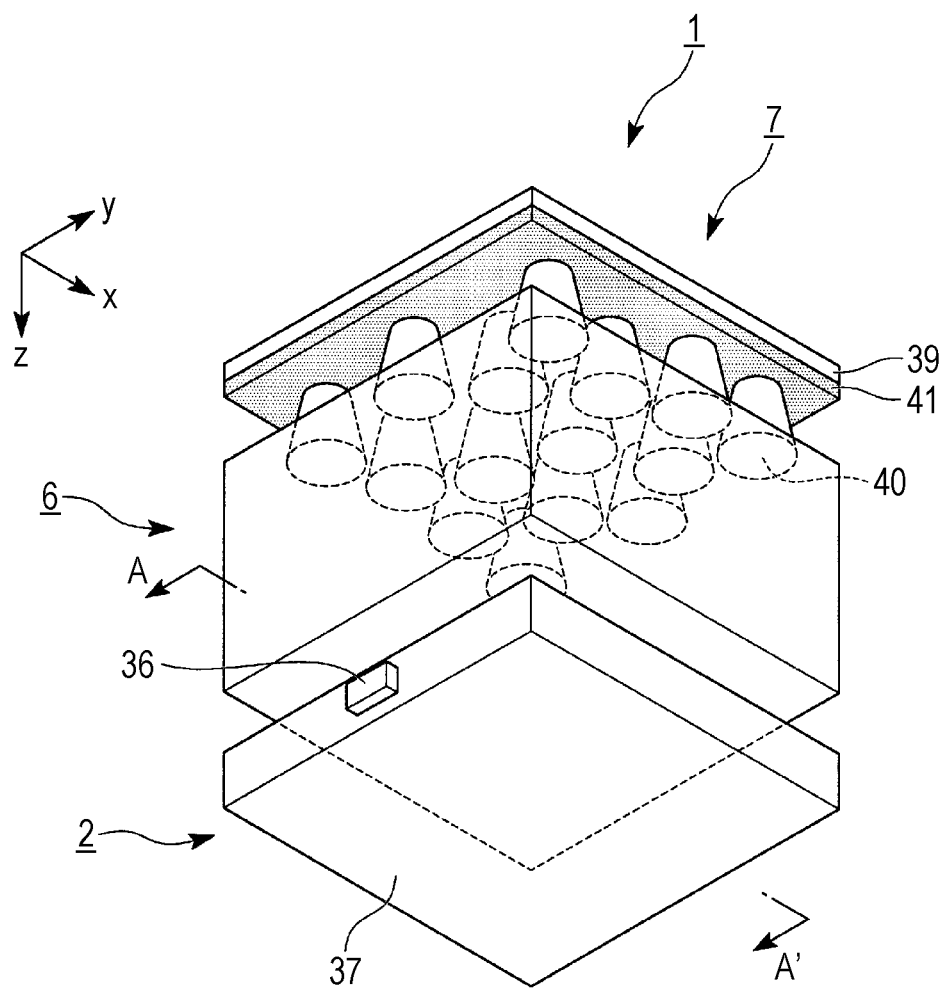
FIG. 1 is a perspective view illustrating a liquid-crystal display device according to a first embodiment.
Figure 2:
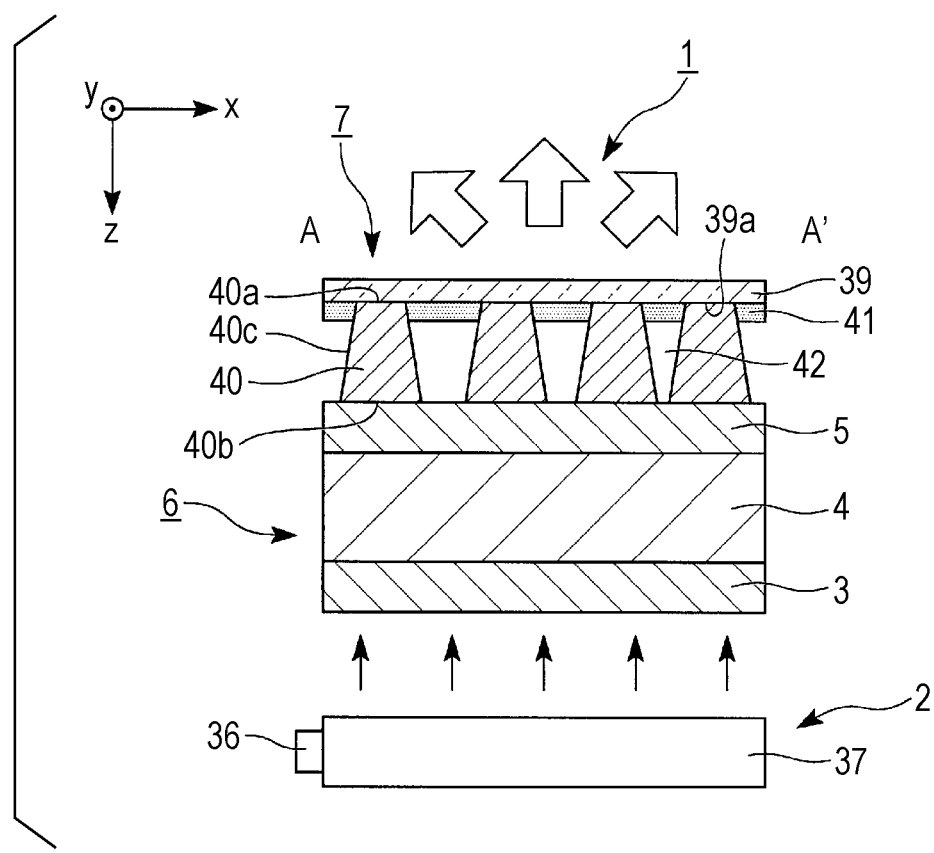
FIG. 2 is a sectional view of the liquid-crystal display device, taken along the A-A' line indicated in FIG. 1.

FIG. 1 is a perspective view illustrating a liquid-crystal display device according to the present embodiment, viewed diagonally from a lower side (back side). FIG. 2 is a sectional view of the liquid-crystal display device according to the present embodiment, taken along the A-A' line indicated in FIG. 1.

As illustrated in FIG. 1 and FIG. 2, a liquid-crystal display device 1 (display device) according to the present embodiment is constituted by a backlight 2, a liquid-crystal display unit 6 (display unit), and a light-diffusing film 7 (light-diffusing member); and the liquid-crystal display unit 6 includes a first polarization plate 3, a liquid-crystal panel 4, and a second polarization plate 5. In FIG. 1, the liquid-crystal display unit 6 is schematically illustrated as a single planar member. In FIG. 2, the liquid-crystal panel 4 is schematically illustrated as a single planar member. Their detailed structures, however, will be described later. A viewer views a display from an upper side of the liquid-crystal display device 1 in FIG. 2 where the light-diffusing film 7 is disposed. Thus, in the following description, the side where the light-diffusing film 7 is disposed is referred to as a viewing side, and the side where the backlight 2 is disposed is referred to as a back side.

In the liquid-crystal display device 1 according to the present embodiment, light emitted from the backlight 2 is modulated by the liquid-crystal panel 4, and a predetermined image, character, or the like is displayed by the modulated light. Upon the light emitted from the liquid-crystal panel 4 passing through the light-diffusing film 7, the angular distribution of the emitted light is broadened as compared with the angular distribution of the light held prior to being incident on the light-diffusing film 7, and the resulting light is emitted from the light-diffusing film 7. In this manner, the viewer can view the display at a broad viewing angle.

Hereinafter, a specific configuration of the liquid-crystal panel 4 will be described.

Here, an active-matrix transmissive liquid-crystal panel will be described as an example, but a liquid-crystal panel that is applicable in an embodiment of the present invention is not limited to an active-matrix transmissive liquid-crystal panel. A liquid-crystal panel that is applicable in an embodiment of the present invention may, for example, be a semi-transmissive (both transmissive and reflective) liquid-crystal panel or a reflective liquid-crystal panel. Furthermore, a liquid-crystal panel that is applicable in an embodiment of the present invention may be a passive-matrix liquid-crystal panel in which the pixels are not provided with switching thin-film transistors (hereinafter, abbreviated to TFTs).

Figure 3:
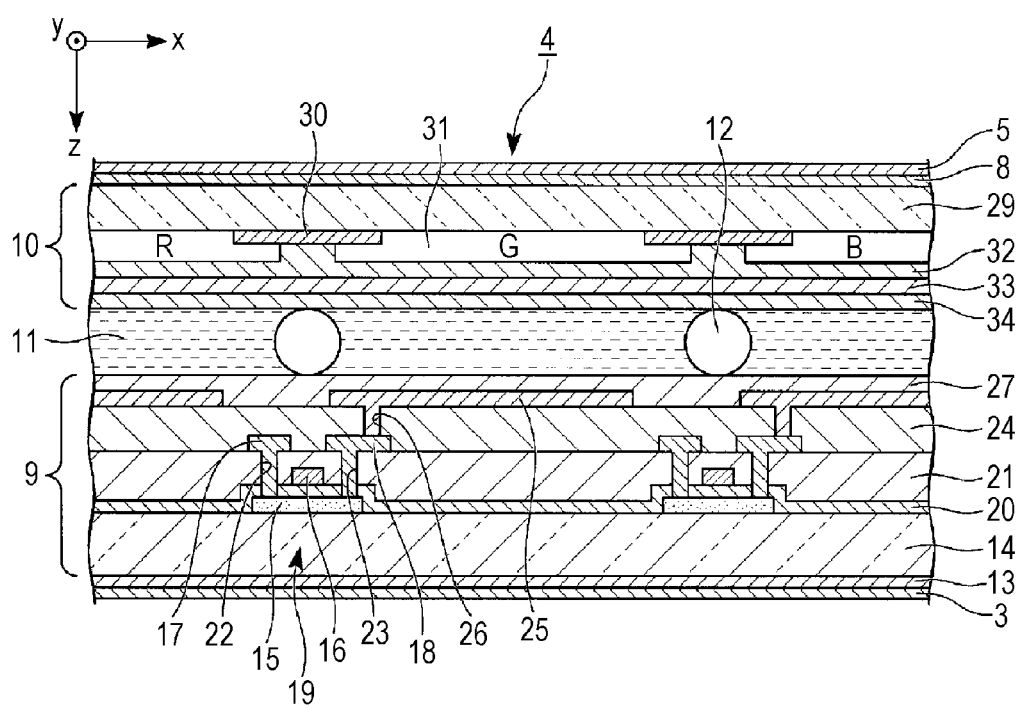
FIG. 3 is a sectional view illustrating a liquid-crystal panel in the liquid-crystal display device according to the present embodiment.

FIG. 3 is a longitudinal sectional view of the liquid-crystal panel 4.

As illustrated in FIG. 3, the liquid-crystal panel 4 includes a TFT substrate 9 serving as a switching element substrate, a color-filter substrate 10 disposed so as to oppose the TFT substrate 9, and a liquid-crystal layer 11 sandwiched between the TFT substrate 9 and the color-filter substrate 10. The liquid-crystal layer 11 is contained within a space enclosed by the TFT substrate 9, the color-filter substrate 10, and a sealing member (not illustrated). The sealing member is a frame member that bonds the TFT substrate 9 and the color-filter substrate 10 with a predetermined gap provided therebetween.

The liquid-crystal panel 4 according to the present embodiment displays, for example, in a VA (vertical alignment) mode, and a vertical-alignment liquid crystal having a negative dielectric anisotropy is used for the liquid-crystal layer 11. Spherical spacers 12 are disposed between the TFT substrate 9 and the color-filter substrate 10 so as to keep the gap between these substrates constant. A display mode is not limited to the aforementioned VA mode, and a TN (twisted nematic) mode, an STN (super twisted nematic) mode, an IPS (in-plane switching) mode, or the like can be employed.

In the TFT substrate 9, a plurality of pixels (not illustrated), which are minimum unit areas of a display, are disposed in a matrix. In the TFT substrate 9, a plurality of source bus lines (not illustrated) are formed so as to extend parallel to one another. In the TFT substrate 9, a plurality of gate bus lines (not illustrated) are formed so as to extend parallel to one another and be orthogonal to the plurality of source bus lines. Thus, the plurality of source bus lines and the plurality of gate bus lines are formed in a lattice pattern in the TFT substrate 9. A rectangular region defined by adjacent source bus lines and adjacent gate bus lines corresponds to a single pixel. The source bus lines are connected to source electrodes of TFTs, which will be described later. The gate bus lines are connected to gate electrodes of the TFTs.

A TFT 19 that includes a semiconductor layer 15, a gate electrode 16, a source electrode 17, a drain electrode 18, and so forth is formed on a transparent substrate 14, which constitutes the TFT substrate 9, on a surface toward the liquid-crystal layer 11. A glass substrate, for example, can be used for the transparent substrate 14. On the transparent substrate 14, the semiconductor layer 15 made of a semiconductor material, such as CGS (continuous grain silicon), LPS (low-temperature poly-silicon), and α-Si, (amorphous silicon), is formed. On the transparent substrate 14, a gate insulating film 20 is formed so as to cover the semiconductor layer 15. The gate insulating film 20 is constituted, for example, by a silicon-oxide film, a silicon-nitride film, or a film in which a silicon-oxide film and a silicon-nitride film are stacked. On the gate insulating film 20, the gate electrode 16 is formed so as to oppose the semiconductor layer 15. The gate electrode 16 is formed, for example, of a layered film of W (tungsten) and TaN (tantalum nitride), Mo (molybdenum), Ti (titanium), Al (aluminum), or the like.

On the gate insulating film 20, a first interlayer insulating film 21 is formed so as to cover the gate electrode 16. The first interlayer insulating film 21 is constituted, for example, by a silicon-oxide film, a silicon-nitride film, or a film in which a silicon-oxide film and a silicon-nitride film are stacked. On the first interlayer insulating film 21, the source electrode 17 and the drain electrode 18 are formed. The source electrode 17 is connected to a source region of the semiconductor layer 15 via a contact hole 22 that passes through the first interlayer insulating film 21 and the gate insulating film 20. In a similar manner, the drain electrode 18 is connected to a drain region of the semiconductor layer 15 via a contact hole 23 that passes through the first interlayer insulating film 21 and the gate insulating film 20. The source electrode 17 and the drain electrode 18 are formed of a conductive material similar to the material of which the above-described gate electrode 16 is formed. On the first interlayer insulating film 21, a second interlayer insulating film 24 is formed so as to cover the source electrode 17 and the drain electrode 18. The second interlayer insulating film 24 is formed of a material similar to the material of which the above-described first interlayer insulating film 21 is formed or of an organic insulating material.

On the second interlayer insulating film 24, a pixel electrode 25 is formed. The pixel electrode 25 is connected to the drain electrode 18 via a contact hole 26 that passes through the second interlayer insulating film 24. Thus, the pixel electrode 25 is connected to the drain region of the semiconductor layer 15 with the drain electrode 18 serving as a relay electrode. The pixel electrode 25 is formed, for example, of a transparent conductive material, such as ITO (indium tin oxide) and IZO (registered trademark, indium zinc oxide). With the configuration above, when a scan signal is supplied through a gate bus line and the TFT 19 enters an on-state, an image signal supplied to the source electrode 17 through a source bus line is supplied to the pixel electrode 25 through the semiconductor layer 15 and the drain electrode 18.

An alignment film 27 is formed across the entire surface of the second interlayer insulating film 24 so as to cover the pixel electrode 25. The alignment film 27 has an alignment regulating force for vertically aligning liquid-crystal molecules constituting the liquid-crystal layer 11. The mode of the TFT may be a top-gate TFT illustrated in FIG. 3 or may be a bottom-gate TFT.

A black matrix 30, a color filter 31, a smoothing layer 32, a counter electrode 33, and an alignment film 34 are formed successively on the transparent substrate 29, which constitutes the color-filter substrate 10, on a surface toward the liquid-crystal layer 11. The black matrix 30 has a function of preventing light from passing therethrough in a region between pixels. The black matrix 30 is formed of metal, such as Cr (chromium) and a multilayer film of Cr and chromium oxide, or of a photoresist in which carbon particles are dispersed in a photosensitive resin. The color filter 31 includes coloring matter of each of red (R), green (G), and blue (B). A color filter 31 of any one of R, G, and B is disposed so as to oppose a single pixel electrode 25 in the TFT substrate 9.

The smoothing layer 32 is constituted by an insulating film that covers the black matrix 30 and the color filter 31. The smoothing layer 32 has a function of reducing and smoothing a step generated by the black matrix 30 and the color filter 31. On the smoothing layer 32, the counter electrode 33 is formed. The counter electrode 33 is formed of a transparent conductive material similar to the material of which the pixel electrode 25 is formed. In addition, the alignment film 34 having the vertical alignment regulating force is formed across the entire surface of the counter electrode 33. The color filter 31 may have a multi-color configuration of three colors of R, G, and B or of more colors.

A first retardation plate 13 is provided between the TFT substrate 9 and the first polarization plate 3. A second retardation plate 8 is provided between the color-filter substrate 10 and the second polarization plate 5.

As illustrated in FIG. 2, the backlight 2 includes a light source 36 and a light guide 37. The light source 36 is disposed on an end-surface of the light guide 37. A light-emitting diode, a cold-cathode tube, or the like, for example, can be used as the light source 36. The backlight 2 according to the present embodiment is an edge-lighting backlight, but a direct-lighting backlight may also be used.

In the present embodiment, the backlight 2 is constituted by a backlight in which the direction in which light is emitted is controlled and the directionality is set loosely to some extent. However, the backlight 2 may have a directionality.

Light incident on the end-surface of the light guide 37 from the light source 36 propagates through the light guide 37 while being totally reflected thereinside, and is emitted from an upper surface (light-emitting surface) of the light guide 37 at a substantially uniform intensity. Although not illustrated, a scattering sheet and a prism sheet are disposed on the upper surface of the light guide 37. The light emitted from the upper surface of the light guide 37 is scattered by the scattering sheet and is then converged by the prism sheet, and thus the light is emitted as substantially parallel light. BEF (trade name) from Sumitomo 3M, for example, can be used as the prism sheet.

As illustrated in FIG. 2, the first polarization plate 3, which functions as a polarizer, is provided between the backlight 2 and the liquid-crystal panel 4. In addition, the second polarization plate 5, which functions as an analyzer, is provided between the liquid-crystal panel 4 and the light-diffusing film 7. In particular, the second polarization plate 5 located on a light-incident side of the light-diffusing film 7 is formed, for example, of triacetyl cellulose (TAC) having a refractive index of 1.50.

Hereinafter, the light-diffusing film 7 will be described in detail.

As illustrated in FIG. 1 and FIG. 2, the light-diffusing film 7 is constituted by a light-transmissive substrate 39, a wavelength-controlling layer 41 formed on a first surface 39a (surface that is opposite to the viewing side) of the light-transmissive substrate 39, and a plurality of light-diffusing portions 40 formed on the first surface 39a of the light-transmissive substrate 39. As illustrated in FIG. 2, the light-diffusing film 7 is disposed on the second polarization plate 5 such that a side on which the light-diffusing portions 40 are provided faces the second polarization plate 5 and a side where the light-transmissive substrate 39 is provided faces toward the viewing side.

The light-transmissive substrate 39 is preferably constituted, for example, by a light-transmissive substrate made of a transparent resin, such as polyethylene terephthalate (PET), triacetyl cellulose (TAC), polycarbonate (PC), polyethylene naphthalate (PEN), polyether sulphone (PES) film. In the present embodiment, a PET film having a refractive index of 1.65 is used as an exemplary material for the light-transmissive substrate. The light-transmissive substrate 39 serves as a base when materials for the wavelength-controlling layer 41 and the light-diffusing portions 40 are applied in a manufacturing process, which will be described later. The light-transmissive substrate 39 needs to have the heat resisting properties and the mechanical strength to withstand a heat-treatment step in the manufacturing process. The light-transmissive substrate 39 may be constituted by a light-transmissive substrate made of glass or the like, aside from a light-transmissive substrate made of resin.

It is preferable that the light-transmissive substrate 39 be thin to an extent that the heat resisting properties and the mechanical strength are not compromised. The reason therefor is that as the light-transmissive substrate 39 is thicker, it is more likely that a display may be blurred. The total light transmittance of the light-transmissive substrate 39 is preferably no less than 90% as defined in JIS K7361-1. When the total light transmittance is no less than 90%, sufficient transparency can be obtained. In the present embodiment, a transparent resin light-transmissive substrate having a thickness of 100 μm is used as an example.

As illustrated in FIG. 2, the wavelength-controlling layer 41 is formed on the first surface 39a of the light-transmissive substrate 39 substantially in a region other than a region where the plurality of light-diffusing portions 40, which will be describe later, are formed. In the present embodiment, the wavelength-controlling layer 41 is formed of a resin material colored in black and functions as a light-shielding layer, as described later.

The expression "being formed substantially in a region other than a region where the light-diffusing portions 40 are formed" is intended to encompass a case in which the wavelength-controlling layer 41 is formed so as to partially overlap the light-diffusing portions 40.

As described later, the wavelength-controlling layer 41 is used as a mask for shielding diffused light when the light-diffusing portions 40 are manufactured (refer to FIG. 5E). Therefore, it is important that the wavelength-controlling layer 41 sufficiently absorb the diffused light (ultraviolet radiation).

The wavelength-controlling layer 41 has characteristics that its optical absorptance at a first wavelength in an ultraviolet wavelength band is higher than its optical absorptance at a second wavelength in a visible-light wavelength band. Here, the first wavelength includes at least a wavelength of diffused light (ultraviolet radiation) radiated when the light-diffusing portions 40 are manufactured. In addition, the second wavelength includes a wavelength of visible light (e.g., 555 nm at which the photopic luminous efficiency function is at a maximum) viewed at a viewer side from the liquid-crystal display unit 6 through the light-diffusing portions 40.

In the present embodiment, the wavelength-controlling layer 41 has characteristics that the transmittance of the diffused light radiated when the light-diffusing portions 40 are manufactured is lower than the transmittance at 555 nm at which the photopic luminous efficiency function is at a maximum.

The wavelength-controlling layer 41 is configured such that the transmittance at the sensitive wavelength of the light-diffusing portions 40 (e.g., 365 nm) is no greater than one-hundredth the transmittance at 555 nm mentioned above.

In order to achieve such a configuration, the wavelength-controlling layer 41 is formed of a material containing an ultraviolet absorptive substance that absorbs ultraviolet radiation (ultraviolet absorber). The ultraviolet absorber may be organic or inorganic and may be of one kind or a combination of a plurality of kinds. With regard to the wavelength-controlling layer 41, it is preferable that, in the L*a*b* color specification system, the a*b* coordinates of the material forming the wavelength-controlling layer 41 be (0,0) and the L* coordinate be 0.

In the present embodiment, the wavelength-controlling layer 41 is formed, for example, of a black resin (resin material) having a light-absorbing property and a photosensitive property, such as a black resist, or an organic material, such as a black ink, with the aforementioned ultraviolet absorber added therein. Such an ultraviolet absorber can be a benzotriazole derivative, a triazine derivative, an oxalic acid anilide derivative, a benzophenone derivative, a salicylate derivative, a benzoate derivative, a hydroxybenzophenone derivative, a cinnamic acid derivative, a hydroquinone derivative, a pyrazoline derivative, or the like. An inorganic ultraviolet absorber can be zinc oxide (ZnO), titanium oxide ($TiO_2$), cerium oxide ($CeO_2$), or the like.

Figure 4:
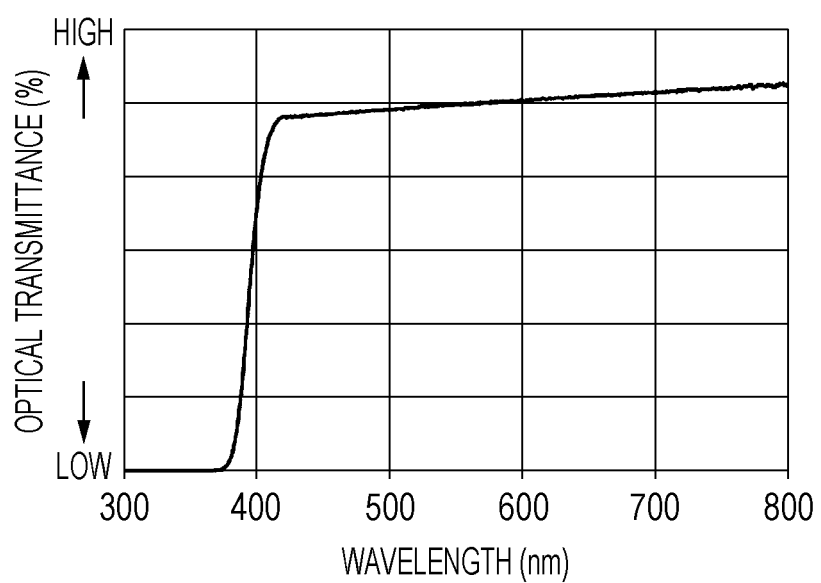
FIG. 4 illustrates optical characteristics of a wavelength-controlling layer according to the present embodiment.

FIG. 4 illustrates optical characteristics (transmission spectrum) of the wavelength-controlling layer 41 according to the present embodiment. In FIG. 4, the horizontal axis represents the wavelength. The vertical axis represents the transmittance of the wavelength-controlling layer 41 at respective wavelengths.

In the present embodiment, the wavelength-controlling layer 41 has a transmittance of 0.1% or less at 365 nm. In the present embodiment, the wavelength-controlling layer 41 has a transmittance of several percent (e.g., 2-3%) in a visible-light band including 555 nm.

As illustrated in FIG. 4, the wavelength-controlling layer 41 has a sufficiently high transmittance in a visible-light band relative to the optical transmittance in an ultraviolet wavelength band including 365 nm. Thus, the wavelength-controlling layer 41 has characteristics that the optical transmittance, which is sufficiently low in the ultraviolet wavelength band, changes stepwise so as to steeply increase and contain a point of inflection around the boundary between ultraviolet radiation and visible light (around 380 nm).

On the basis of this configuration, the light-diffusing film 7 can shield the light (outside light) that has entered from the viewer side and has passed through the light-transmissive substrate 39 by substantially absorbing with the wavelength-controlling layer 41. Meanwhile, although some of the light that has not been absorbed is reflected toward the viewer by the interface with the light-diffusing portions 40, the reflected light is shielded again by the wavelength-controlling layer 41, and thus scattering of the outside light can be prevented.

The wavelength-controlling layer 41 may be formed by stacking a plurality of materials. In this case, the wavelength-controlling layer 41 is formed, for example, of a single kind of metal, such as Cr (chromium), or a metal material, such as a layered film of Cr and chromium oxide and the above-described ultraviolet absorber stacked therein.

The light-diffusing portions 40 are formed, for example, of an organic material having a light-transmitting property and a photosensitive property, such as an acrylic resin and an epoxy resin. In one example of the present embodiment, the light-diffusing portions 40 are formed of an acrylic resin having a refractive index of 1.50. The total light transmittance of the light-diffusing portions 40 is preferably no less than 90% as defined in JIS K7361-1. When the total light transmittance is no less than 90%, sufficient transparency can be obtained. As illustrated in FIG. 1 and FIG. 2, the light-diffusing portion 40 has a circular horizontal section (xy-section). The light-diffusing portion 40 has a smaller area on a light-emitting end-surface 40a located toward the light-transmissive substrate 39 and has a larger area on a light-incident end-surface 40b located opposite to the light-transmissive substrate 39, and the area of the horizontal section becomes gradually larger from the side of the light-emitting end-surface 40a toward the side of the light-incident end-surface 40b. The light-diffusing portion 40 has a so-called reverse-tapered frustoconical shape as viewed from the side of the light-transmissive substrate 39.

The light-diffusing portions 40 contribute to transmission of light in the light-diffusing film 7. Light incident on the light-diffusing portion 40 is guided in a state in which the light is substantially confined within the light-diffusing portion 40 while being totally reflected by a tapered side surface 40c of the light-diffusing portion 40 and is then emitted. The plurality of light-diffusing portions 40 are disposed aperiodically and non-periodically as viewed in the normal direction to the first surface 39a of the light-transmissive substrate 39. Here, it is defined that the x-axis corresponds to the horizontal direction of the screen of the liquid-crystal panel 4, the y-axis corresponds to the vertical direction of the screen of the liquid-crystal panel 4; and the z-axis corresponds to the thickness direction of the liquid-crystal display device 1.

As illustrated in FIG. 2, the light-diffusing portion 40 includes the light-emitting end-surface 40a, the light-incident end-surface 40b, and the side surface 40c. The light-emitting end-surface 40a makes contact with the light-transmissive substrate 39. The light-incident end-surface 40b is opposite to the light-emitting end-surface 40a. The side surface 40c is a tapered side surface of the light-diffusing portion 40. The side surface 40c reflects light that has entered through the light-incident end-surface 40b. The area of the light-incident end-surface 40b is greater than the area of the light-emitting end-surface 40a.

The light-diffusing portions 40 contribute to transmission of light in the light-diffusing film 7. In other words, light incident on the light-diffusing portion 40 is guided in a state in which the light is substantially confined within the light-diffusing portion 40 while being totally reflected by the side surface 40c of the light-diffusing portion 40 and is then emitted.

The angle of inclination of the side surface 40c of the light-diffusing portion 40 (angle formed by the light-incident end-surface 40b and the side surface 40c) is preferably 75° or greater and 85° or less. In the present embodiment, the angle of inclination of the side surface 40c of the light-diffusing portion 40 is 75°. However, the angle of inclination of the side surface 40c of the light-diffusing portion 40 is not particularly limited as long as the side surface 40c is inclined at an angle that allows incident light to be sufficiently diffused when the light is emitted from the light-diffusing film 7. In the present embodiment, the angle of inclination of the side surface 40c of the light-diffusing portion 40 is constant.

In addition, the height of the light-diffusing portion 40 from the light-incident end-surface 40b to the light-emitting end-surface 40a is set to be greater than the thickness of the wavelength-controlling layer 41. In the case of the present embodiment, the thickness of the thickness of the wavelength-controlling layer 41 is approximately 150 nm, for example. The height of the light-diffusing portion 40 from the light-incident end-surface 40b to the light-emitting end-surface 40a is approximately 20 μm, for example. A portion enclosed by the side surfaces 40c of the light-diffusing portions 40 and the thickness of the wavelength-controlling layer 41 is an air-cavity 42.

It is desirable that the refractive index of the light-transmissive substrate 39 be substantially equal to the refractive index of the light-diffusing portions 40. The reason therefor is as follows. For example, a case in which the refractive index of the light-transmissive substrate 39 greatly differs from the refractive index of the light-diffusing portions 40 will be considered. In this case, when light entering through the light-incident end-surface 40b is emitted from the light-diffusing portion 40, unwanted refraction or reflection of the light may occur at an interface between the light-diffusing portion 40 and the light-transmissive substrate 39. In this case, an unfavorable situation may occur; for example, a desired viewing angle cannot be obtained, or the quantity of emitted light is reduced.

In the case of the present embodiment, the air is present in the air-cavity 42 (outside the light-diffusing portions 40). Therefore, when the light-diffusing portion 40 is formed, for example, of a transparent acrylic resin, the side surface 40c of the light-diffusing portion 40 serves as an interface between the transparent acrylic resin and the air. Here, the air-cavity 42 may be filled with a material having a low refractive index. However, the difference in the refractive index at the interface between the inside and the outside of the light-diffusing portion 40 is at a maximum when the air is present, as compared to a case in which any other material with a low refractive index is present outside the light-diffusing portion 40.

Therefore, in accordance with the Snell's law, the critical angle is at a minimum in the configuration of the present embodiment, and the range of the angle of incidence that allows the light to be totally reflected by the side surface 40c of the light-diffusing portion 40 becomes broadest. Consequently, loss of light can be further suppressed, and high luminance can be obtained.

In the present embodiment, that a material having a low refractive index is present means that the surroundings of the light-diffusing portions 40 are put in a low-refractive-index state so that light can be totally reflected. Accordingly, the aforementioned state includes a state in which the air-cavity 42 is filled with an inert gas, such as nitrogen, in place of the air. Alternatively, the interior of the air-cavity 42 may be in a vacuum state or may be at a pressure lower than the atmospheric pressure.

Incident light that is incident at an angle greater than the critical angle passes through the light-diffusing portion 40 while being totally reflected by the side surface 40c and is emitted toward the viewer side. Incident light that passes through the light-diffusing portion 40 without being incident on the side surface 40c is emitted as-is toward the viewer side. Meanwhile, incident light that is incident at an angle equal to or less than the critical angle is not totally reflected and passes through the side surface 40c of the light-diffusing portion 40. In the case of the present embodiment, the wavelength-controlling layer 41 is provided in a region other than the region where the light-diffusing portions 40 are formed. In the present embodiment, the wavelength-controlling layer 41 is primarily formed of a black resin and thus absorbs light that has passed through the side surfaces 40c of the light-diffusing portions 40. Therefore, a display is not blurred, and the contrast is not reduced. However, as the quantity of light that passes through the side surfaces 40c of the light-diffusing portions 40 increases, loss in the quantity of light occurs, and an image with high luminance may not be obtained. In this case, a directional backlight having directionality of emitting light so as not to be incident on the side surface 40c of the light-diffusing portion 40 at an angle equal to or less than the critical angle may be used as the above-described backlight 2.

Subsequently, a method for manufacturing the liquid-crystal display device 1 having the above-described configuration will be described with reference to FIG. 5A to FIG. 5F, FIG. 6, FIG. 7A, and FIG. 7B.

Hereinafter, the process of manufacturing the light-diffusing film 7 will be primarily described.

An example of an overview of the process of manufacturing the liquid-crystal display unit 6 will first be described. First, the TFT substrate 9 and the color-filter substrate 10 are each fabricated. Thereafter, the TFT substrate 9 and the color-filter substrate 10 are disposed such that the surface on which the TFT 19 is formed opposes a surface on which the color filter 31 is formed, and then the TFT substrate 9 and the color-filter substrate 10 are bonded with a sealing member interposed therebetween. Thereafter, a liquid crystal is injected into a space enclosed by the TFT substrate 9, the color-filter substrate 10, and the sealing member. The first retardation plate 13, the second retardation plate 8, the first polarization plate 3, and the second polarization plate 5 are bonded to the two surfaces of the liquid-crystal panel 4, which has been formed as described above, by using an optical adhesive or the like.

Through the above-described process, the liquid-crystal display unit 6 is completed.

The TFT substrate 9 and the color-filter substrate 10 are manufactured through methods that are publicly known to date, and thus descriptions thereof will be omitted.

Figure 5A:
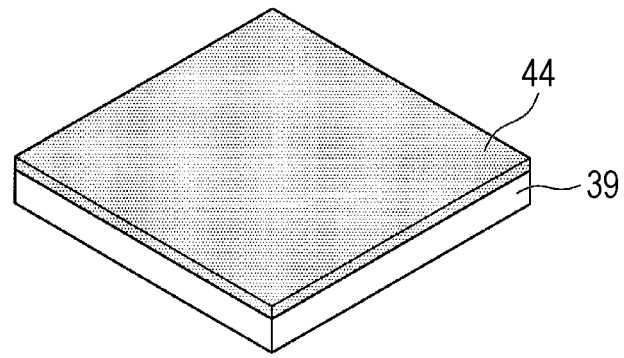
FIG. 5A is a perspective view illustrating a method for manufacturing a light-diffusing film.

First, as illustrated in FIG. 5A, the light-transmissive substrate 39 of a PET film that measures 10 cm on each side and has a thickness of 100 μm is prepared. A black negative resist that contains carbon and an ultraviolet absorber (titanium oxide) serving as the material for the wavelength-controlling layer 41 is applied on one surface of the light-transmissive substrate 39 by spin-coating so as to form a coating film 44 having a thickness of 150 nm.

Subsequently, the light-transmissive substrate 39 on which the coating film 44 has been formed is placed on a hot plate, and the coating film is prebaked at a temperature of 90° C. Thus, a solvent in the black negative resist evaporates.

Figure 5B:
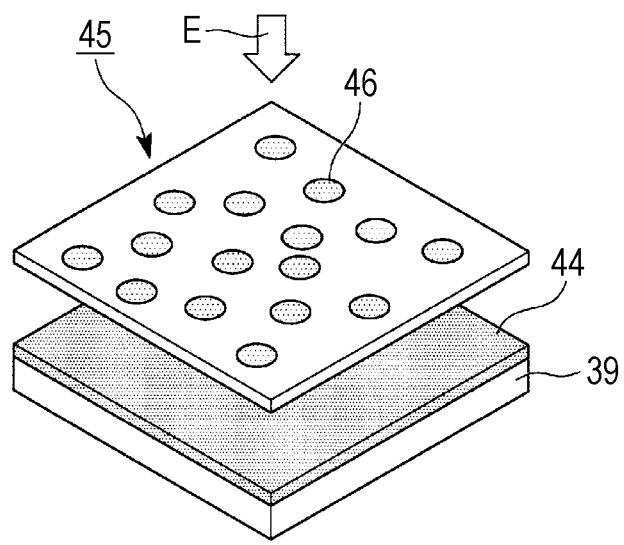
FIG. 5B is another perspective view illustrating the method for manufacturing the light-diffusing film.
Figure 6:
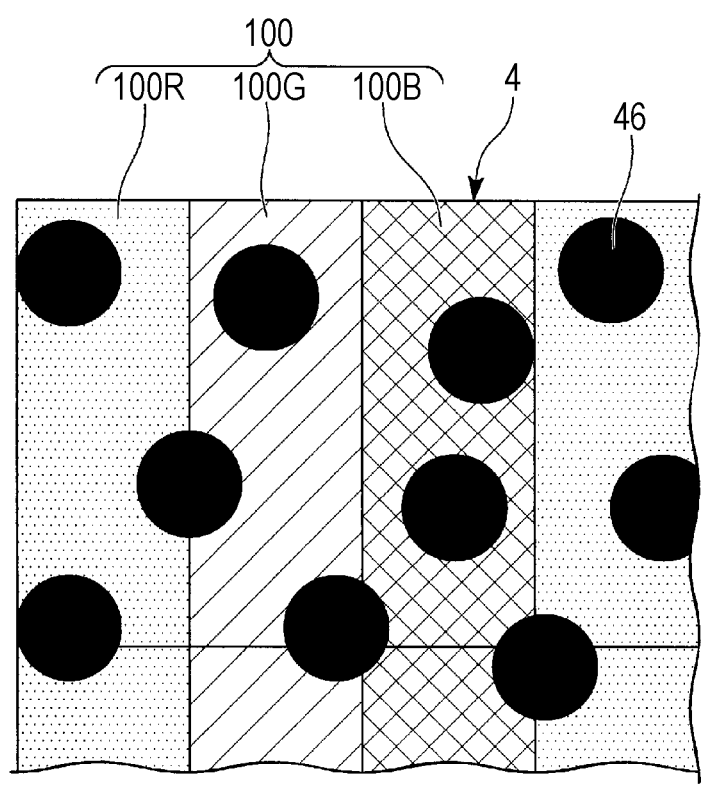
FIG. 6 illustrates a positional relationship between a pixel in a liquid-crystal panel and light-shielding patterns.

Subsequently, as illustrated in FIG. 5B, with the use of an exposure device, the coating film 44 is irradiated and exposed with light through a photomask 45 in which a plurality of light-shielding patterns 46 are non-periodically disposed. At this point, an exposure device that uses a mixed line of the i-line at a wavelength of 365 nm, the h-line at a wavelength of 404 nm, and the g-line at a wavelength of 436 nm is used. The exposure amount is 100 mJ/cm$^2$. In the case of the present embodiment, a transparent negative resist is exposed with the wavelength-controlling layer 41 serving as a mask in a later process so as to form the light-diffusing portions 40, and thus the positions of the light-shielding patterns 46 in the photomask 45 correspond to the positions at which the light-diffusing portions 40 are to be formed. The plurality of light-shielding patterns 46 are each a circular pattern having a diameter of 20 μm and are disposed non-periodically. Therefore, an interval (pitch) between adjacent light-shielding patterns 46 is not constant, but a mean interval obtained by averaging the intervals among the plurality of light-shielding patterns 46 is 25 μm. FIG. 6 illustrates a positional relationship between a pixel 100 in the liquid-crystal panel 4 and the light-shielding patterns 46. As illustrated in FIG. 6, when the pixel 100 in the liquid-crystal panel 4 and the light-shielding patterns 46 are viewed from the above, it is desirable that at least a part of a single light-shielding pattern 46 be located in a portion corresponding to a single dot in the liquid-crystal panel 4. A single pixel 100 in the liquid-crystal panel 4 is constituted by three dots 100R, 100G, and 100B of red (R), green (G), and blue (B). Through this configuration, at least one light-diffusing portion 40 is formed in a single pixel 100, and thus light can be emitted toward the viewer side in a state in which information on a single dot 100R, 100G, or 100B has reliably been broadened.

Figure 5C:
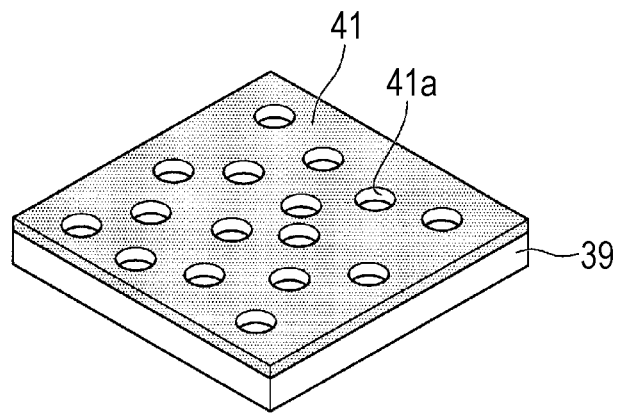
FIG. 5C is yet another perspective view illustrating the method for manufacturing the light-diffusing film.

After the coating film 44 has been exposed with the use of the above-described photomask 45, the coating film 44 constituted by the black negative resist is developed with dedicated developer and is dried at 100° C. Thus, as illustrated in FIG. 5C, the wavelength-controlling layer 41 having a plurality of circular openings 41a is formed on the first surface of the light-transmissive substrate 39. The circular openings 41a correspond to regions where the light-diffusing portions 40 are formed in a later process. Although the wavelength-controlling layer 41 is formed through photolithography with the use of a black negative resist in the present embodiment, instead of this configuration, a positive resist can also be used if a photomask in which the light-shielding patterns 46 according to the present embodiment and a light-transmitting portion are reversed is used. Alternatively, the wavelength-controlling layer 41 may be formed through a printing method, such as gravure printing, inkjet printing, and screen printing.

Figure 5D:
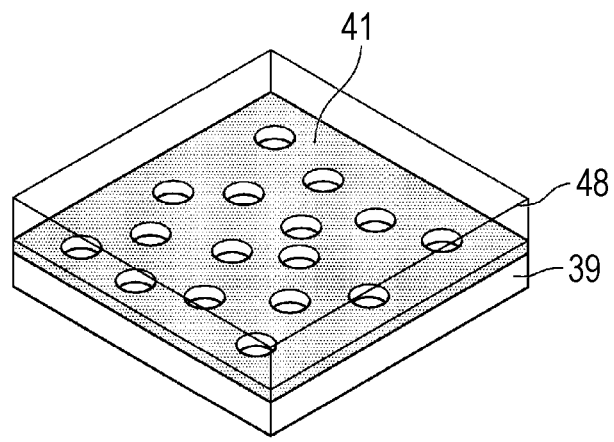
FIG. 5D is yet another perspective view illustrating the method for manufacturing the light-diffusing film.

Subsequently, as illustrated in FIG. 5D, a transparent negative resist of an acrylic resin serving as a material for the light-diffusing member is applied on the upper surface of the wavelength-controlling layer 41 by slit-coating, spin-coating, printing, or the like so as to form a coating film 48 having a thickness of 25 μm.

Subsequently, the light-transmissive substrate 39 on which the coating film 48 has been formed is placed on a hot plate, and the coating film 48 is prebaked at a temperature of 95° C. Thus, a solvent in the transparent negative resist evaporates.

Figure 5E:
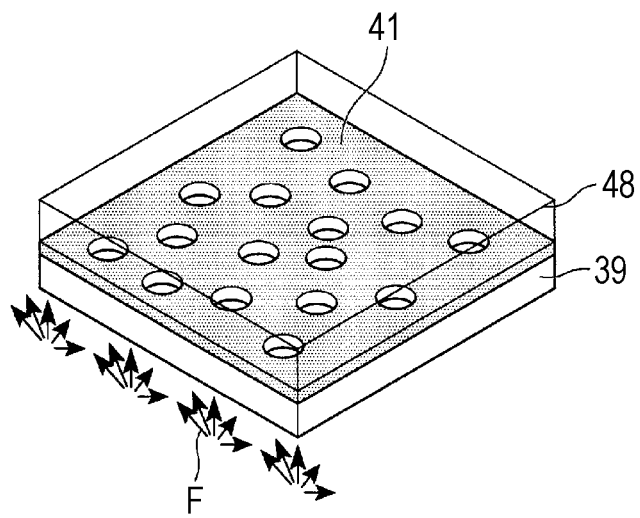
FIG. 5E is yet another perspective view illustrating the method for manufacturing the light-diffusing film.

Subsequently, as illustrated in FIG. 5E, the coating film 48 is irradiated and exposed with diffused light F from the side of the light-transmissive substrate 39 with the wavelength-controlling layer 41 serving as a mask. At this point, an exposure device that uses a mixed line of the i-line at a wavelength of 365 nm, the h-line at a wavelength of 404 nm, and the g-line at a wavelength of 436 nm is used. The exposure amount is 500 mJ/cm$^2$. In addition, as a means for converting parallel light emitted from the exposure device to the diffused light F and irradiating the light-transmissive substrate with the diffused light F, for example, a diffuser having a haze of approximately 50 may be disposed in an optical path of the light emitted from the exposure device.

Thereafter, the light-transmissive substrate 39 on which the coating film 48 has been formed is placed on a hot plate, and the coating film 48 is subjected to post-exposure bake (PEB) at a temperature of 95° C.

Figure 5F:
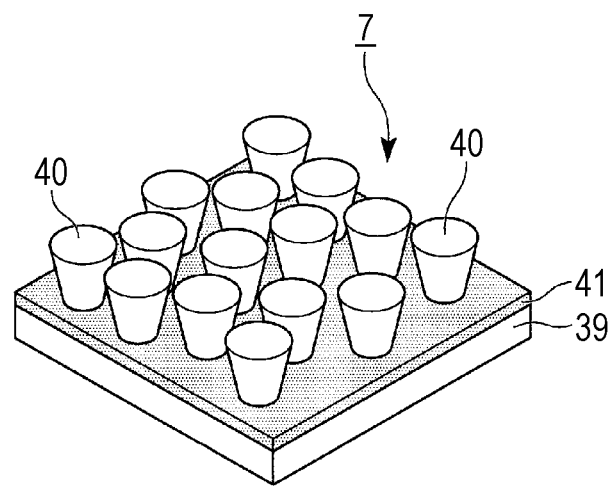
FIG. 5F is yet another perspective view illustrating the method for manufacturing the light-diffusing film.

Subsequently, the coating film 48 constituted by the transparent negative resist is developed with dedicated developer and is post-baked at 100° C. Thus, as illustrated in FIG. 5F, the plurality of light-diffusing portions 40 are formed on the first surface of the light-transmissive substrate 39. Through the process described above, the light-diffusing film 7 according to the present embodiment is completed.

Instead of bonding the second polarization plate on the liquid-crystal panel, the second polarization plate 5 may be bonded to the surface that is to serve as the light-incident end-surfaces 40b of the light-diffusing portions 40 after the light-diffusing film is fabricated through the process described above. In that case, an integrated member obtained by bonding the second polarization plate 5 in advance to the above-described light-diffusing film 7 may serve as an end item of the light-diffusing film. When such a light-diffusing film is used, a liquid-crystal display unit can be fabricated by bonding the light-diffusing film to a liquid-crystal panel that does not include the second polarization plate 5.

The exposure is carried out with diffused light in the present embodiment, and thus the transparent negative resist constituting the coating film 48 is exposed in a radial form so as to expand outwardly from a region (opening 41a) where the wavelength-controlling layer 41 is not formed. Thus, the reverse-tapered light-diffusing portion 40 is formed. The angle of inclination of the side surface 40c of the light-diffusing portion 40 can be controlled in accordance with the degree of diffusion of the diffused light.

In the present embodiment, the wavelength-controlling layer 41 is formed of a black resin that contains an ultraviolet absorber (titanium-oxide particles).

Figure 7A:
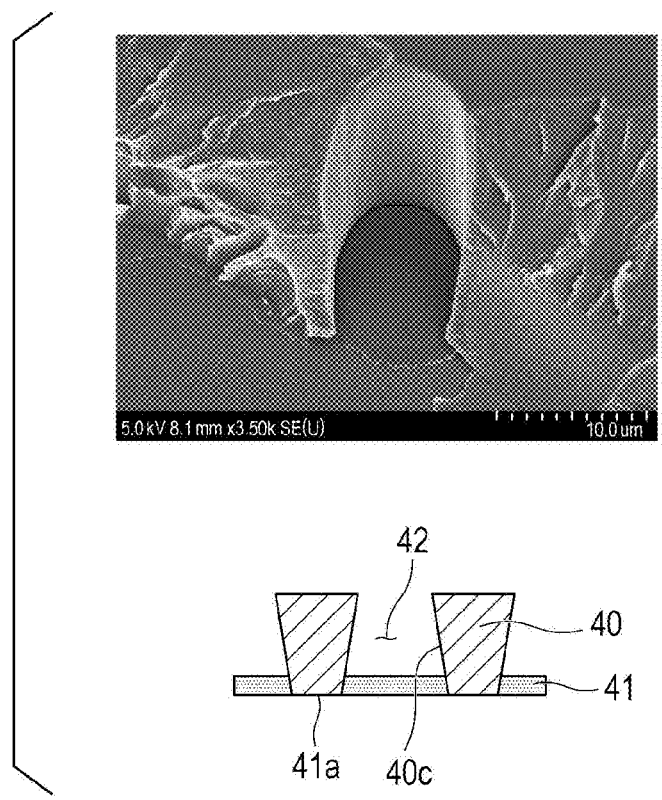
FIG. 7A is an illustration for describing an effect of a wavelength-controlling layer.
Figure 7B:
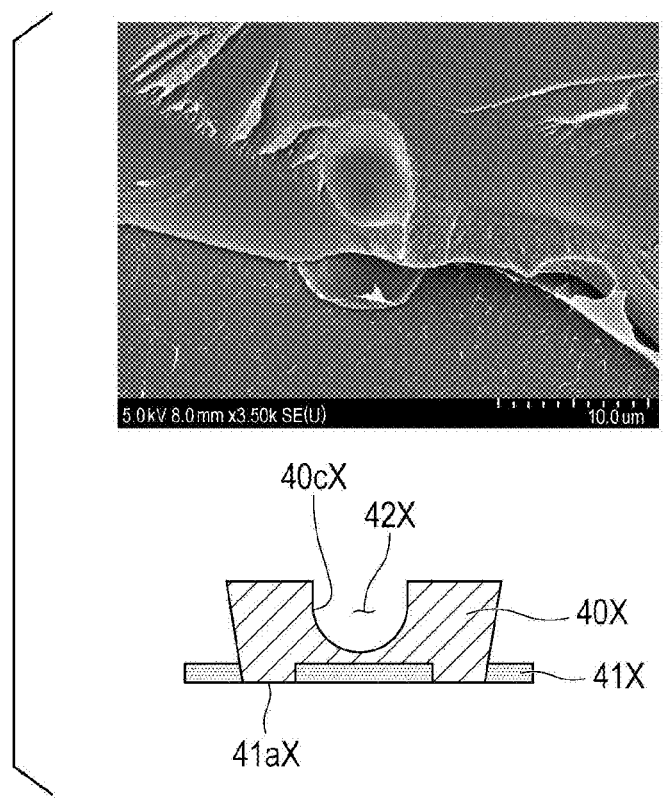
FIG. 7B is an illustration for describing an effect of another wavelength-controlling layer.

FIG. 7A is an illustration for describing an effect of the wavelength-controlling layer 41 and is a photograph illustrating a primary portion of the light-diffusing portion 40. Meanwhile, for comparison, FIG. 7B illustrates an effect of a wavelength-controlling layer 41X that does not include an ultraviolet absorber and illustrates a primary portion of a light-diffusing portion 40X.

As illustrated in FIG. 7A, as the wavelength-controlling layer 41 contains the ultraviolet absorber, the transmittance of the diffused light (ultraviolet radiation) is sufficiently low. Therefore, the wavelength-controlling layer 41 can reliably shield the diffused light F in a region other than the openings 41a. Thus, the side surface 40c of the light-diffusing portion 40 can be formed to have a predetermined taper angle, and the air-cavity 42 is formed between the light-diffusing portions 40.

In the meantime, in the wavelength-controlling layer 41X that does not contain the ultraviolet absorber, some of the diffused light F is transmitted through a region other than openings 41aX, and thus the transparent negative resist (coating film 48) on the wavelength-controlling layer 41X is also partially exposed. Consequently, as illustrated in FIG. 7B, the light-diffusing portion 40X is formed so as to cover the wavelength-controlling layer 41X. In this case, the area of an air-cavity 42X formed between the light-diffusing portions 40X is reduced, and side surfaces 40cX are shortened. Thus, the light-diffusing property of the light-diffusing portions 40X is reduced.

Figure 8:
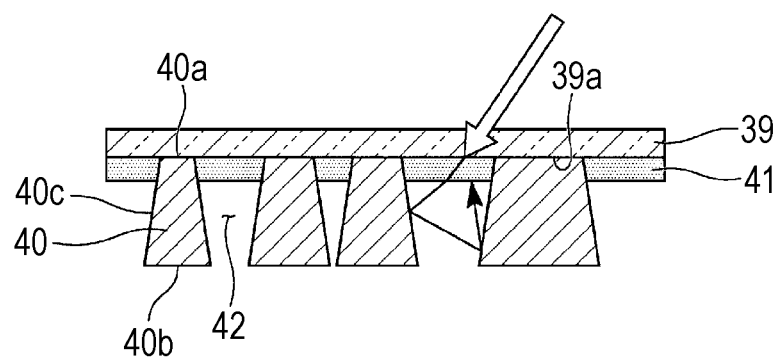
FIG. 8 is an illustration for describing an effect of preventing outside-light scattering by a wavelength-controlling layer.

As described thus far, according to the present embodiment, the wavelength-controlling layer 41 is formed of a black resin that contains an ultraviolet absorber (titanium-oxide particles), and thus the light-diffusing portion 40 including the side surface 40c having a predetermined taper angle as described above can be formed. Accordingly, the light-diffusing portion 40 has the desired light-diffusing characteristics. Furthermore, as illustrated in FIG. 8, the wavelength-controlling layer 41 is black, and thus light (outside light) that has entered from the viewer side and passed through the light-transmissive substrate 39 can be shielded by substantially absorbing the light with the wavelength-controlling layer 41. It is known that the transmittance of light decreases exponentially relative to the optical path length, and thus even in a case in which some of the light that has not been absorbed is reflected toward the viewer side by an interface with the light-diffusing portion 40, the reflected light is shielded again by the wavelength-controlling layer 41, and thus scattering of the outside light can be prevented. Accordingly, even in the case of the wavelength-controlling layer 41 having a low optical absorptance in a visible light band (the L* coordinate is greater than 0), scattering of the outside light can be prevented.

It is preferable that the total light transmittance of the light-diffusing film 7 be no less than 90%. When the total light transmittance is no less than 90%, sufficient transparency can be obtained, and optical performance required for a light-diffusing film can be exhibited to a sufficient extent. The total light transmittance is defined in JIS K7361-1.

Figure 9:
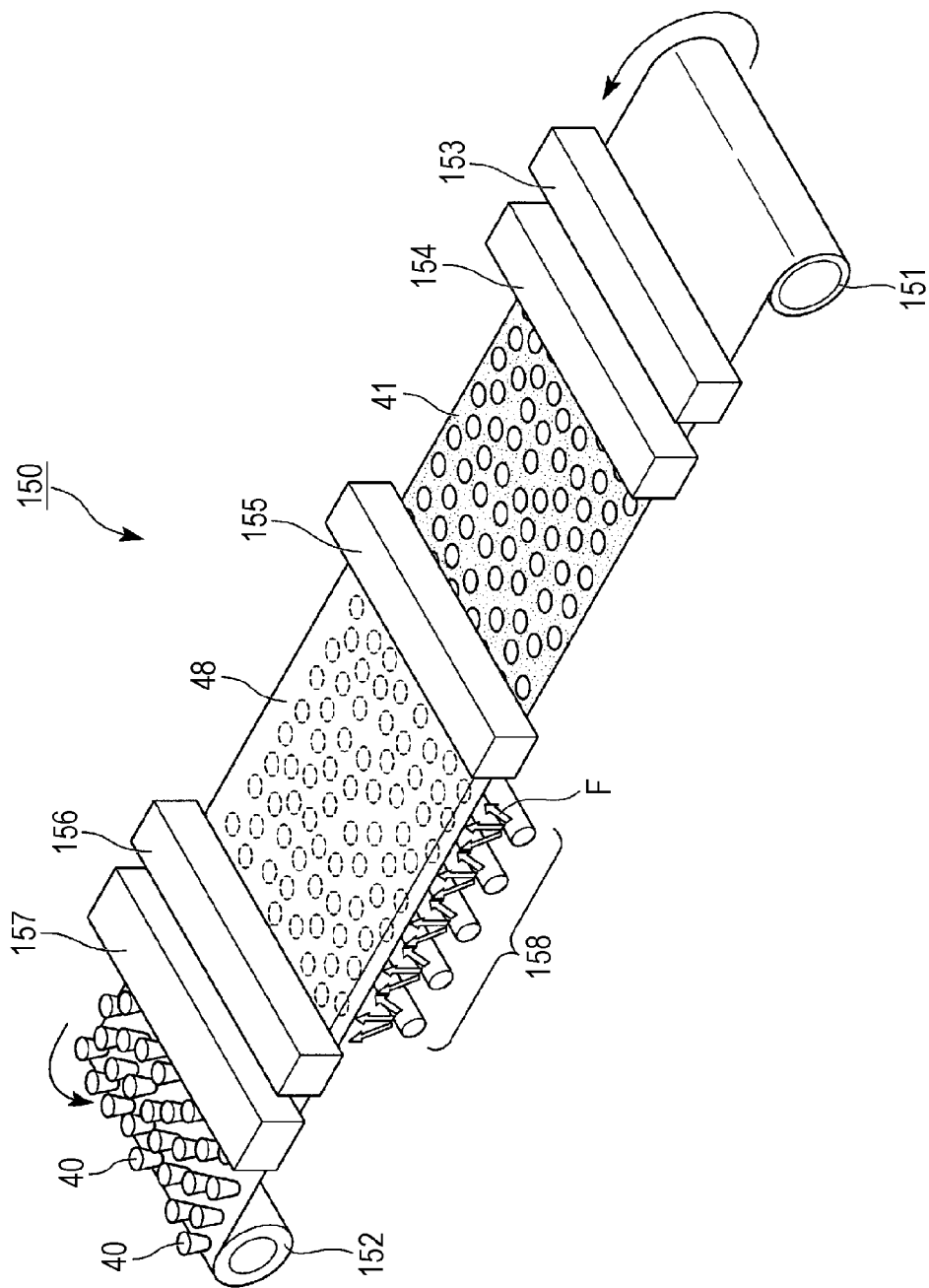
FIG. 9 is a schematic configuration diagram illustrating an example of a device for manufacturing a light-diffusing film.

FIG. 9 is a schematic configuration diagram illustrating an example of a device for manufacturing the light-diffusing film 7.

A manufacturing device 150 illustrated in FIG. 9 transports the long light-transmissive substrate 39 roll-to-roll and carries out various processes therebetween. The manufacturing device 150 forms the wavelength-controlling layer 41 by printing, in place of the photolithography process in which the photomask 45 described above is used.

The manufacturing device 150 is provided, at a first end thereof, with a feed roller 151 that feeds out the light-transmissive substrate 39 and provided, at a second end thereof, with a take-up roller 152 that takes up the light-transmissive substrate 39. The light-transmissive substrate 39 moves from the side of the feed roller 151 toward the take-up roller 152. Over the light-transmissive substrate 39, a printing device 153, a first drying device 154, a coating device 155, a developing device 156, and a second drying device 157 are successively disposed from the side of the feed roller 151 toward the take-up roller 152.

An exposure device 158 is disposed below the light-transmissive substrate 39.

The printing device 153 is for printing the wavelength-controlling layer 41 on the light-transmissive substrate 39. The first drying device 154 is for drying the wavelength-controlling layer 41 formed through printing. The coating device 155 is for coating the wavelength-controlling layer 41 with a transparent negative resist that is to serve as the light-diffusing portions 40. The developing device 156 is for developing the exposed transparent negative resist with developer. The second drying device 157 is for drying the light-transmissive substrate 39 on which the light-diffusing portions 40 formed of the developed transparent resist are formed. In the manufacturing device 150, the manufacturing processes may be continuous as illustrated in FIG. 9 or the manufacturing processes may be divided into several sections. Thereafter, the light-diffusing film 7 may be bonded with the second polarization plate 5 so as to form an integrated unit.

Although a liquid resist is applied when the wavelength-controlling layer 41 and the light-diffusing portions 40 are formed in the present example, in place of this configuration, a film-type resist may be affixed to the first surface of the light-transmissive substrate 39. In addition, the manufacturing process may be modified as appropriate with an added or deleted step in accordance with the shape and fabrication conditions of a resist to be used.

Lastly, the completed light-diffusing film 7 is bonded to the liquid-crystal display unit 6 with an optical adhesive or the like in a state in which the light-transmissive substrate 39 faces the viewing side and the light-diffusing portions 40 oppose the second polarization plate 5, as illustrated in FIG. 2. An optical adhesive to be used has a refractive index that is equal to the refractive index of the light-diffusing portions 40 and the refractive index of the second polarization plate 5.

At this point, the light-diffusing film 7 is bonded to the liquid-crystal display unit 6 such that a portion in which the light-diffusing portions 40 or the wavelength-controlling layer 41 is formed extends outside the pixel region of the liquid-crystal panel 4. The light-diffusing portions 40 and the wavelength-controlling layer 41 may be formed across one surface of the light-transmissive substrate 39 in the light-diffusing film 7, or the light-diffusing film 7 may include a portion at least in a part of a peripheral area of the light-transmissive substrate 39 in which the light-diffusing portion or the wavelength-controlling layer is not formed.

Through the above-described process, the liquid-crystal display device 1 according to the present embodiment is completed.

An effect of the liquid-crystal display device 1 according to the present embodiment will be described.

As described above, the liquid-crystal display device 1 according to the present embodiment is provided with the light-diffusing film 7 that includes the wavelength-controlling layer 41 containing an ultraviolet absorber, and thus light emitted from the liquid-crystal panel 4 is favorably diffused by the light-diffusing film 7. Thus, a viewer can view a bright display at a broad viewing angle. In addition, when the light-diffusing film 7 that includes the wavelength-controlling layer 41 having a high enough light-transmitting property in a visible-light band to prevent outside light from scattering is affixed, light emitted from the backlight 2 passes through the wavelength-controlling layer 41, and thus the liquid-crystal display device 1 having higher front luminance can be obtained.

Although a case in which the plurality of light-diffusing portions 40 are all formed into an identical shape is illustrated as an example in the present embodiment, the light-diffusing portions 40 may have a variety of different sizes.

In addition, the planar shape of the light-diffusing portion 40 may be, aside from being circular, polygonal, hemispherical, or the like. Alternatively, some of the light-diffusing portions 40 may be formed so as to overlap one another.

(Second Embodiment)

Hereinafter, a second embodiment of the present invention will be described with reference to FIG. 10 to FIG. 12E.

The basic configuration of a liquid-crystal display device according to the present embodiment is identical to that of the first embodiment, and only the configuration of a light-diffusing film differs from that of the first embodiment. Therefore, the description of the basic configuration of the liquid-crystal display device is omitted, and only the light-diffusing film will be described in the present embodiment.

Figure 10:
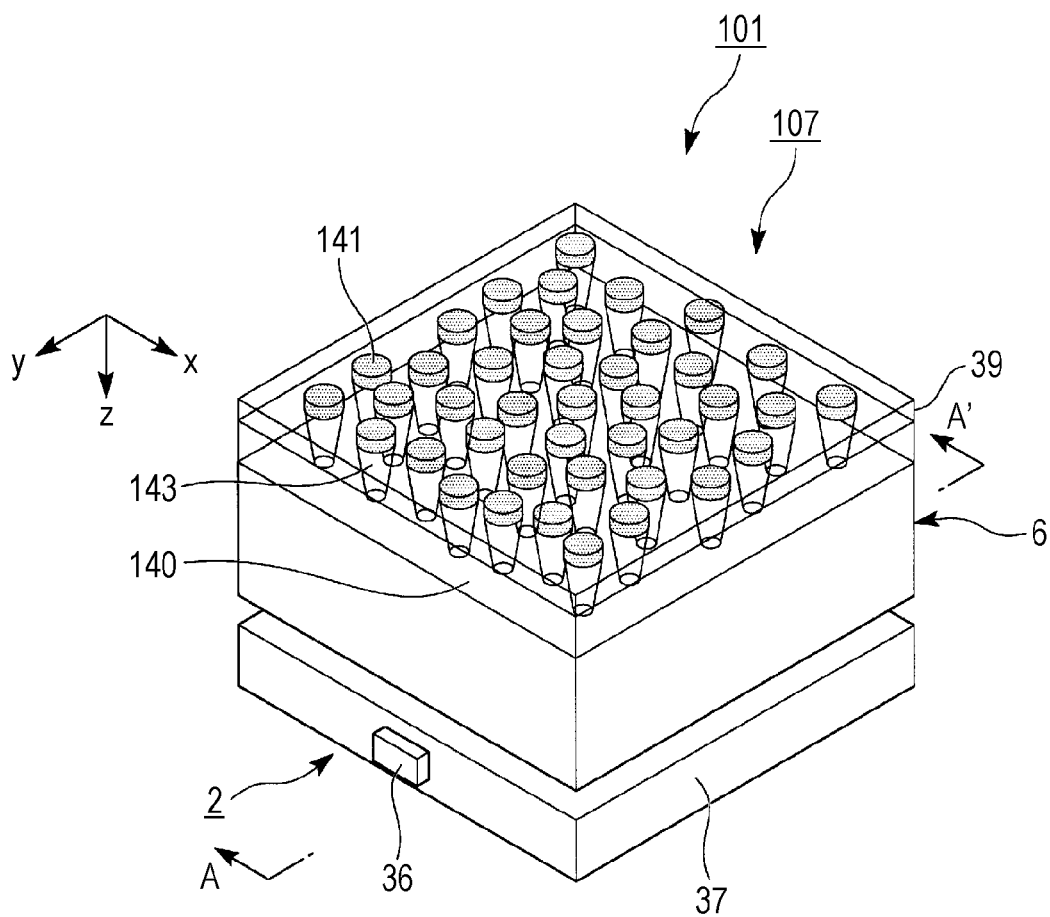
FIG. 10 is a perspective view illustrating a liquid-crystal display device according to a second embodiment.
Figure 11:
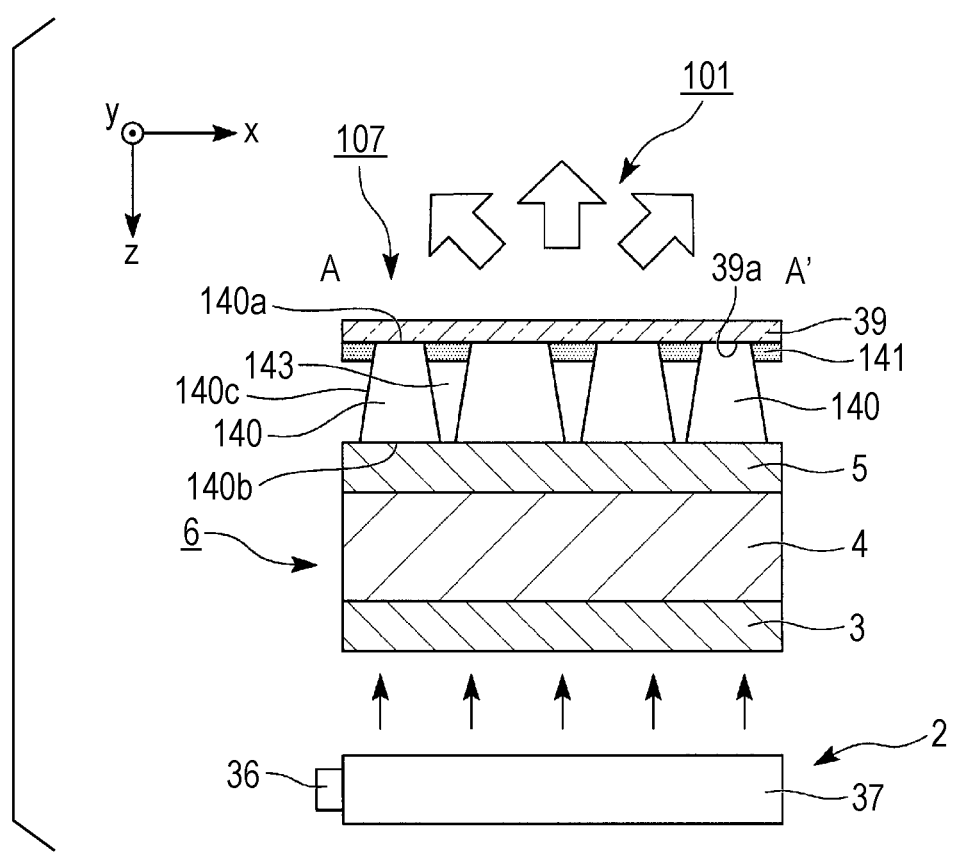
FIG. 11 is a sectional view of the liquid-crystal display device, taken along the A-A' line indicated in FIG. 10.

FIG. 10 is a perspective view illustrating the liquid-crystal display device according to the present embodiment. FIG. 11 is a sectional view of the liquid-crystal display device according to the present embodiment, taken along the A-A' line indicated in FIG. 10. FIG. 12A to FIG. 12E are perspective views sequentially illustrating the processes of manufacturing the light-diffusing film according to the present embodiment.

In FIG. 10 to FIG. 12E, constituent elements that are common to those in the drawings used to describe the first embodiment are given identical reference characters, and detailed descriptions thereof will be omitted.

The light-diffusing film 7 according to the first embodiment includes the plurality of light-diffusing portions 40 formed on one surface of the light-transmissive substrate 39, and the wavelength-controlling layer 41 formed on the first surface of the light-transmissive substrate 39 in a region other than the region where the light-diffusing portions 40 are formed. The plurality of light-diffusing portions 40 are disposed so as to be interspersed as viewed in the normal direction to the first surface of the light-transmissive substrate 39, and the wavelength-controlling layer 41 is formed continuously in a region other than the region where the light-diffusing portions 40 are formed. In the meantime, as illustrated in FIG. 10 and FIG. 11, a light-diffusing film 107 according to the present embodiment includes a plurality of wavelength-controlling layers 141 formed on the first surface 39a of the light-transmissive substrate 39, and a light-diffusing portion 140 formed on the first surface 39a of the light-transmissive substrate 39 substantially in a region other than the region where the wavelength-controlling layers 141 are formed. The plurality of wavelength-controlling layers 141 are disposed so as to be interspersed as viewed in the normal direction to the first surface 39a of the light-transmissive substrate 39, and the light-diffusing portion 140 is formed continuously in a region other than the region where the wavelength-controlling layers 141 are formed.

Here, the expression "the light-diffusing portion 140 formed substantially in a region other than the region where the wavelength-controlling layers 141 are formed" is intended to encompass a case in which the light-diffusing portion 140 is formed so as to partially overlap the wavelength-controlling layers 141.

The plurality of wavelength-controlling layers 141 are disposed aperiodically and non-periodically so as to be interspersed on the light-transmissive substrate 39. Along with the above, a plurality of air-cavities 143 formed at the same positions as the plurality of wavelength-controlling layers 141 are also disposed non-periodically on the light-transmissive substrate 39.

In the present embodiment, the planar shape of a single wavelength-controlling layer 141 as viewed in the normal direction to the light-transmissive substrate 39 is circular. The wavelength-controlling layer 141 has a diameter of, for example, 10 μm. The plurality of wavelength-controlling layers 141 all have the same diameter. As the plurality of wavelength-controlling layers 141 are formed so as to be interspersed on the light-transmissive substrate 39, the light-diffusing portion 140 located in a region where the wavelength-controlling layers 141 are not formed is formed continuously on the light-transmissive substrate 39.

In the region on the light-diffusing film 107 where the wavelength-controlling layers 141 are formed, the air-cavities 143 each having a shape whose sectional area along a plane parallel to the first surface 39a of the light-transmissive substrate 39 is greater toward the side of the wavelength-controlling layer 141 and becomes gradually smaller as the distance from the wavelength-controlling layer 141 increases are formed. In other words, the air-cavity 143 has a so-called forward-tapered substantially frustoconical shape as viewed from the side of the light-transmissive substrate 39. The air may be present inside the air-cavities 143. A portion of the light-diffusing film 107 other than the air-cavities 143, or in other words, a portion where the light-diffusing portion 140 is continuously present contributes to transmission of light. Light incident on the light-diffusing portion 140 is guided in a state in which the light is confined within the light-diffusing portion 140 while being totally reflected by an interface between the light-diffusing portion 140 and the air-cavity 143 and is then emitted to the outside through the light-transmissive substrate 39.

In the case of the present embodiment, as the air is present inside the air-cavities 143, when the light-diffusing portion 140 is formed, for example, of a transparent resin, a side surface 140c of the light-diffusing portion 140 serves as an interface between the transparent resin and the air. Here, the refractive index difference at the interface between the inside and the outside of the light-diffusing portion 140 is greater when the air-cavities 143 are filled with the air than when the surroundings of the light-diffusing portion 140 is filled with another typical low-refractive-index material. Therefore, in accordance with the Snell's law, the range of the angle of incidence that allows the light to be totally reflected by the side surface 140c of the light-diffusing portion 140 is broad. Consequently, loss of light can be further suppressed, and high luminance can be obtained.

The air-cavities 143 may be filled with an inert gas, such as nitrogen, in place of the air. Alternatively, the interiors of the air-cavities 143 may be in a vacuum state.

Subsequently, a method for manufacturing a liquid-crystal display device 101 having the above-described configuration will be described with reference to FIG. 12A to FIG. 12E.

Hereinafter, a process of manufacturing the light-diffusing film 107 will be described, and descriptions of a process of manufacturing the liquid-crystal display unit will be omitted.

Figure 12A:
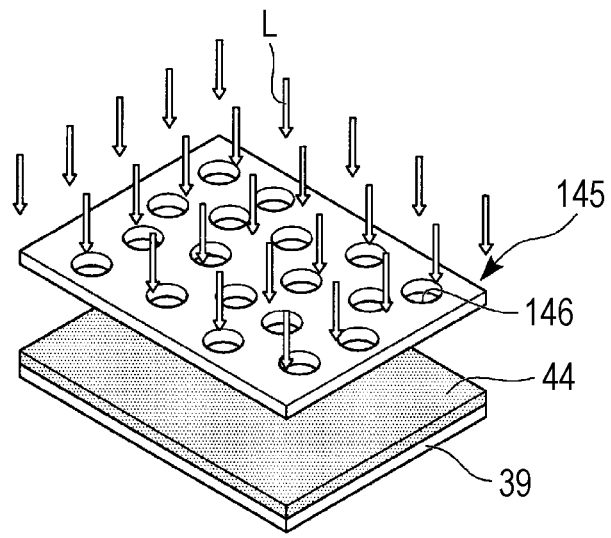
FIG. 12A is a perspective view illustrating a method for manufacturing a light-diffusing film.

First, as illustrated in FIG. 12A, the light-transmissive substrate 39 of polyethylene terephthalate that measures 10 cm on each side and has a thickness of 100 μm is prepared. A black negative resist that contains carbon and an ultraviolet absorber (titanium oxide) serving as the material for the wavelength-controlling layers 141 is applied on one surface of the light-transmissive substrate 39 by spin-coating so as to form the coating film 44 having a thickness of 150 nm.

Subsequently, the light-transmissive substrate 39 on which the coating film 44 has been formed is placed on a hot plate, and the coating film is prebaked at a temperature of 90° C. Thus, a solvent in the black negative resist evaporates.

Subsequently, with the use of an exposure device, the coating film 44 is irradiated and exposed with light L through a photomask 145 in which a plurality of opening patterns 146 each having a circular planar shape are formed. At this point, an exposure device that uses a mixed line of the i-line at a wavelength of 365 nm, the h-line at a wavelength of 404 nm, and the g-line at a wavelength of 436 nm is used. The exposure amount is 100 mJ/cm$^2$.

As illustrated in FIG. 12A, the photomask 145 to be used when the wavelength-controlling layers 141 are formed includes the plurality of circular opening patterns 146 that are non-periodically disposed. When the photomask 145 is designed, the opening patterns 146 are first disposed regularly with a constant pitch. Then, the positions of the opening patterns 146 are varied by providing fluctuation to reference position data of the opening patterns 146, such as the center points of the opening patterns 146, for example, by using a random function, and thus the photomask 145 having the plurality of opening patterns 146 that are non-periodically disposed can be fabricated.

Figure 12B:
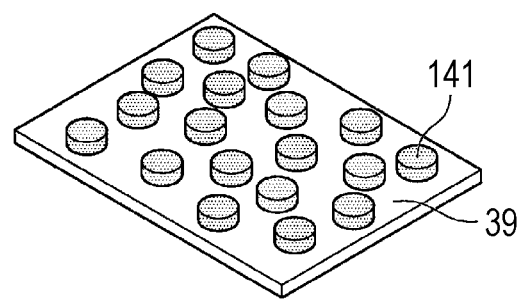
FIG. 12B is another perspective view illustrating the method for manufacturing the light-diffusing film.

After the coating film 44 has been exposed with the use of the photomask 145, the coating film 44 constituted by the black negative resist is developed with dedicated developer and is dried at 100° C. Thus, as illustrated in FIG. 12B, the plurality of wavelength-controlling layers 141 each having a circular planar shape are formed on the first surface of the light-transmissive substrate 39. In the case of the present embodiment, a transparent negative resist is exposed with the wavelength-controlling layers 141 formed of a black negative resist serving as a mask in a later process so as to form the air-cavities 143. Therefore, the positions of the opening patterns 146 in the photomask 145 correspond to the positions at which the air-cavities 143 are formed. The circular wavelength-controlling layers 141 correspond to a region where the light-diffusing portion 140 is not formed (the air-cavities 143) in a later process. The plurality of opening patterns 146 are each a circular pattern having a diameter of 10 μm.

Although the wavelength-controlling layers 141 are formed through the photolithography process with the use of a black negative resist in the present embodiment, instead of this configuration, a positive resist having a light-absorbing property can also be used if a photomask in which the opening patterns 146 according to the present embodiment and a light-shielding pattern are reversed is used. Alternatively, the wavelength-controlling layers 141 that have been patterned through a vapor deposition method or a printing method may directly be formed.

Figure 12C:
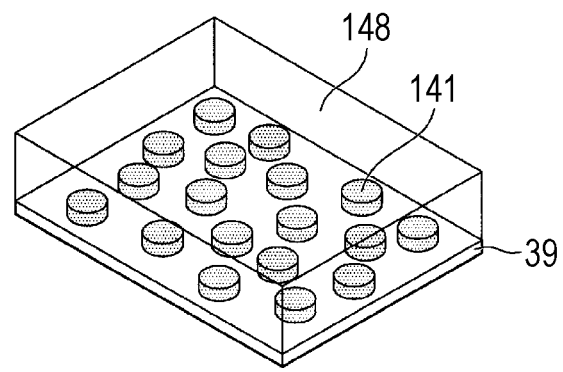
FIG. 12C is yet another perspective view illustrating the method for manufacturing the light-diffusing film.

Subsequently, as illustrated in FIG. 12C, a transparent negative resist of an acrylic resin serving as the material for the light-diffusing portion 140 is applied on the entire surface of the first surface of the light-transmissive substrate 39 by slit-coating, spin-coating, printing, or the like so as to cover the wavelength-controlling layers 141, and thus a coating film 148 having a thickness of 25 μm is formed.

Subsequently, the light-transmissive substrate 39 on which the coating film 148 has been formed is placed on a hot plate, and the coating film 148 is prebaked at a temperature of 95° C. Thus, a solvent in the transparent negative resist evaporates.

Figure 12D:
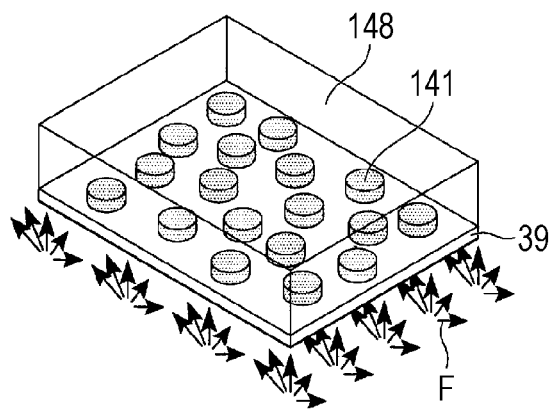
FIG. 12D is yet another perspective view illustrating the method for manufacturing the light-diffusing film.

Subsequently, as illustrated in FIG. 12D, the coating film 148 is irradiated and exposed with the diffused light F from the side of the light-transmissive substrate 39 with the wavelength-controlling layers 141 serving as a mask. At this point, an exposure device that uses a mixed line of the i-line at a wavelength of 365 nm, the h-line at a wavelength of 404 nm, and the g-line at a wavelength of 436 nm is used. The exposure amount is 600 mJ/cm².

In the exposure process, parallel light or diffused light is used. In addition, as a means for converting parallel light emitted from the exposure device to the diffused light F and irradiating the light-transmissive substrate 39 with the diffused light F, a diffuser having a haze of approximately 50 is disposed in an optical path of the light emitted from the exposure device. As the exposure is carried out with the diffused light F, the coating film 148 is exposed in a radial form so as to extend outwardly from a region where the wavelength-controlling layer 41 is not formed. Thus, the forward-tapered air-cavity 143 is formed, and a reverse-tapered side surface is formed on the light-diffusing portion 140 at a portion facing the air-cavity 143.

Thereafter, the light-transmissive substrate 39 on which the above-described coating film 48 has been formed is placed on a hot plate, and the coating film 48 is subjected to post-exposure bake (PEB) at a temperature of 95° C.

Figure 12E:
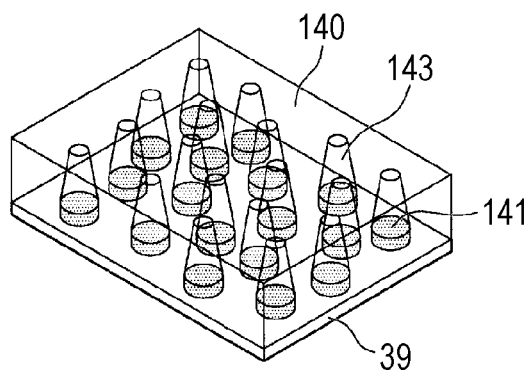
FIG. 12E is yet another perspective view illustrating the method for manufacturing the light-diffusing film.

Subsequently, the coating film 48 constituted by the transparent negative resist is developed with dedicated developer and is post-baked at 100° C. Thus, as illustrated in FIG. 12E, the light-diffusing portion 140 having the plurality of air-cavities 143 is formed on the first surface of the light-transmissive substrate 39.

Through the process described above, the light-diffusing film 107 according to the present embodiment is completed.

Although a liquid resist is applied when the wavelength-controlling layers 141 and the light-diffusing portion 140 are formed in the above-described example, in place of this configuration, a film-type resist may be affixed to the first surface of the light-transmissive substrate 39.

Lastly, the completed light-diffusing film 107 is bonded to the liquid-crystal display unit 6 with an optical adhesive or the like in a state in which the light-transmissive substrate 39 faces the viewing side and the light-diffusing portion 140 opposes the second polarization plate 5, as illustrated in FIG. 11.

Through the above-described process, the liquid-crystal display device 101 according to the present embodiment is completed.

In the present embodiment as well, the wavelength-controlling layers 141 are formed of a black resin containing an ultraviolet absorber (titanium-oxide particles), and thus the light-diffusing portion 140 can be patterned into a predetermined shape in a state in which the diffused light F is reliably shielded in a region other than the openings 41a (refer to FIG. 7A).

Accordingly, in the liquid-crystal display device 101 according to the present embodiment as well, the light-diffusing film 107 having a predetermined taper angle is provided, and thus similar effects to those of the first embodiment can be obtained. Specifically, light emitted from the liquid-crystal panel 4 is favorably diffused by the light-diffusing film 107, and a liquid-crystal display device that is capable of a bright display at a broad viewing angle can be implemented.

In addition, in the present embodiment, the plurality of air-cavities 143 provided in the light-diffusing film 107 are isolated from one another, and the portion serving as the light-diffusing portion 140 has a continuous shape. Thus, even if the density of the air-cavities 143 is increased and the volume of the light-diffusing portion 140 is reduced in order to increase the degree of diffusion of the light, for example, a sufficient contact area between the light-diffusing portion 140 and the light-transmissive substrate 39 can be secured, and thus the bonding strength between the light-diffusing portion 140 and the light-transmissive substrate 39 is high. Therefore, the light-diffusing portion 140 is not likely to be damaged by external force or the like and can fulfill a desired light-diffusing function.

Although a case in which the plurality of wavelength-controlling layers 141 are all formed into an identical shape is illustrated as an example in the present embodiment, the wavelength-controlling layers 141 may have a variety of different sizes.

In addition, the planar shape of the wavelength-controlling layer 141 may be, aside from being circular, polygonal, hemispherical, or the like. Alternatively, some of the wavelength-controlling layers 141 may be formed so as to overlap one another.

(Third Embodiment)

Hereinafter, a third embodiment of the present invention will be described with reference to FIG. 13 and FIG. 14.

The basic configuration of a liquid-crystal display device according to the present embodiment is identical to that of the second embodiment, and only the configuration of a light-diffusing film differs from that of the second embodiment. Therefore, the description of the basic configuration of the liquid-crystal display device is omitted, and only the light-diffusing film will be described in the present embodiment.

Figure 13:
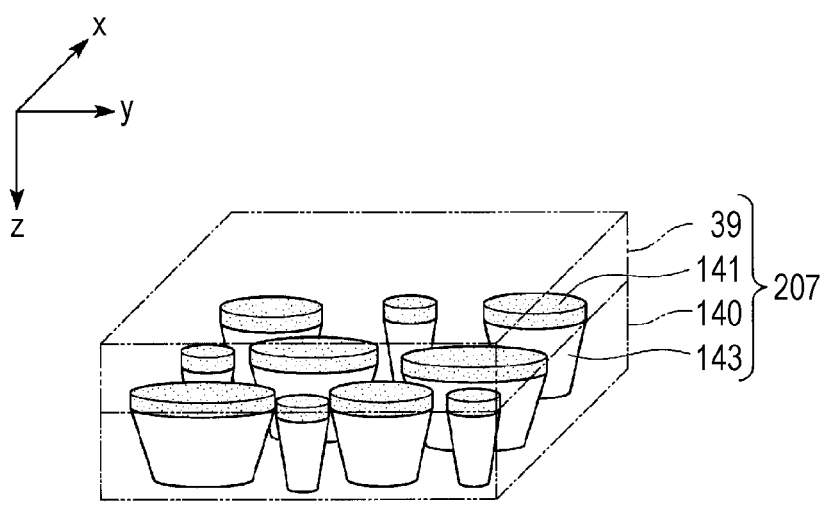
FIG. 13 is a perspective view of a light-diffusing film according to a third embodiment, viewed from a viewing side.

FIG. 13 is a perspective view of a light-diffusing film 207, viewed from the viewing side. FIG. 14 is a schematic diagram of the light-diffusing film 207. In FIG. 14, a diagram in an upper-left side is a plan view of the light-diffusing film 207. A diagram in a lower-left side is a sectional view taken along the A-A line indicated in the plan view in the upper-left side. A diagram in an upper-right side is a sectional view taken along the B-B line indicated in the plan view in the upper-left side.

As illustrated in FIG. 13, the light-diffusing film 207 includes the light-transmissive substrate 39, the plurality of wavelength-controlling layers 141, and the light-diffusing portion 140. The plurality of wavelength-controlling layers 141 are formed on one surface of the light-transmissive substrate 39 (surface opposite to the viewing side). The light-diffusing portion 140 is formed on the one surface of the light-transmissive substrate 39 substantially in a region other than a region where the wavelength-controlling layers 141 are formed.

Here, the expression "the light-diffusing portion 140 formed substantially in a region other than the region where the wavelength-controlling layers 141 are formed" is intended to encompass a case in which the light-diffusing portion 140 is formed so as to partially overlap the wavelength-controlling layers 141.

Figure 14:
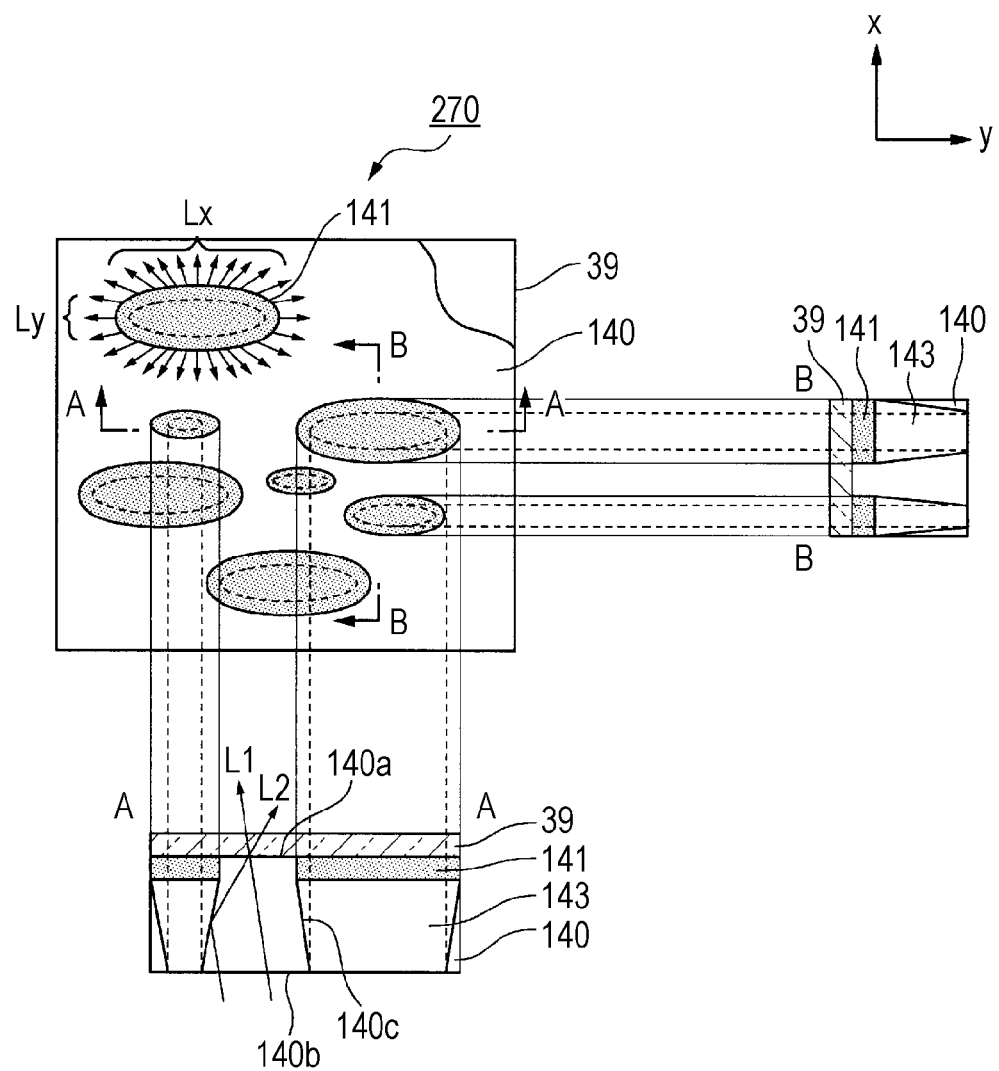
FIG. 14 is a plan view of the light-diffusing film.

As illustrated in the diagram in the upper-left side of FIG. 14, in the light-diffusing film 207 according to the present embodiment, the plurality of wavelength-controlling layers 141 are disposed so as to be interspersed on the one surface of the light-transmissive substrate 39. The planar shape of the wavelength-controlling layer 141 as viewed in the normal direction to the light-transmissive substrate 39 is an elongated ellipse. The wavelength-controlling layer 141 has an anisotropic shape having a major axis and a minor axis. The ratio of the length of the major axis to the length of the minor axis of the ellipse is, for example, 1.1 or greater and 2.5 or less.

The length of the major axis of the wavelength-controlling layer 141 is, for example, 20 μm, and the length of the minor axis of the wavelength-controlling layer 141 is, for example, 10 μm. In the light-diffusing film 207 according to the present embodiment, the ratio of the length of the minor axis to the length of the major axis is substantially the same among the wavelength-controlling layers 141.

The proportion of the area occupied by the wavelength-controlling layers 141 relative to the total area of the light-transmissive substrate 39 is, for example, 30%±10%.

As illustrated in the diagrams in the lower-left side and the upper-right side of FIG. 14, a portion underneath the wavelength-controlling layer 141 serves as the elliptical frusto-conical air-cavity 143. The light-diffusing film 207 includes the plurality of air-cavities 143. The light-diffusing portion 140 is provided continuously in a portion other than the plurality of air-cavities 143.

In the light-diffusing film 207 according to the present embodiment, the directions of the major axes of the elliptical planar shapes of the respective wavelength-controlling layers 141 (hereinafter, also referred to as a major-axis direction of the wavelength-controlling layer) substantially all extend in the y-direction. The directions of the minor axes of the elliptical planar shapes of the respective wavelength-controlling layers 141 (hereinafter, also referred to as a minor-axis direction of the wavelength-controlling layer) substantially all extend in the x-direction. Thus, when the orientation of the side surface 140c of the light-diffusing portion 140 is considered, of the side surfaces 140c of the light-diffusing portion 140, the proportion of the side surfaces 140c along the y-direction is greater than the proportion of the side surfaces 140c along the x-direction. Therefore, the amount of light Lx that is reflected by the side surfaces 140c along the y-direction and is diffused in the x-direction is greater than the amount of light Ly that is reflected by the side surfaces 140c along the x-direction and is diffused in the y-direction. Therefore, the azimuthal direction in which the diffusion property of the light-diffusing film 207 is relatively high is the x-direction, which is the minor-axis direction of the wavelength-controlling layers 141.

In the present embodiment, the light-diffusing film 207 is bonded to the liquid-crystal panel such that the azimuthal direction in which the diffusion property is relatively high coincides with the direction in which the viewing angle characteristics are to be improved in the liquid-crystal panel. The viewing angle characteristics of the liquid-crystal panel differ as appropriate in accordance with a display mode.

In the present embodiment as well, the wavelength-controlling layers 141 are formed of a black resin that contains an ultraviolet absorber (titanium-oxide particles), and thus the light-diffusing portion 140 is patterned into a predetermined shape. Accordingly, similar effects to those of the above-described embodiments can be obtained. Specifically, light emitted from the liquid-crystal panel 4 is favorably diffused by the light-diffusing film 107, and a liquid-crystal display device that is capable of a bright display at a broad viewing angle can be implemented.

Although the ratio of the length of the minor axis to the length of the major axis is substantially the same among the wavelength-controlling layers 141 in the present embodiment, a wavelength-controlling layer 141 in which the ratio of the length of the minor axis to the length of the major axis is different may also be provided.

In addition, although the wavelength-controlling layers 141 are disposed such that their major axes extend in the same direction in the present embodiment, the plurality of wavelength-controlling layers 141 may be disposed such that the major axes of some of the wavelength-controlling layers 141 extend in a direction different from the direction in which the major axes of the other wavelength-controlling layers 141 extend.

In addition, although the plurality of wavelength-controlling layers 141 are all disposed so as to be interspersed in the present embodiment, some of the plurality of wavelength-controlling layers 141 may be connected to some other wavelength-controlling layers 141.

In addition, although the plurality of wavelength-controlling layers 141 all have an elliptical shape in the present embodiment, some of the plurality of wavelength-controlling layers 141 may have another shape, such as a rectangular shape.

(Fourth Embodiment)

Hereinafter, a fourth embodiment of the present invention will be described with reference to FIG. 15 and FIG. 16.

The basic configuration of a liquid-crystal display device according to the present embodiment is identical to that of the first embodiment, and only the configuration of a light-diffusing film differs from that of the first embodiment. Therefore, the description of the basic configuration of the liquid-crystal display device is omitted, and only the light-diffusing film will be described in the present embodiment.

Figure 15:
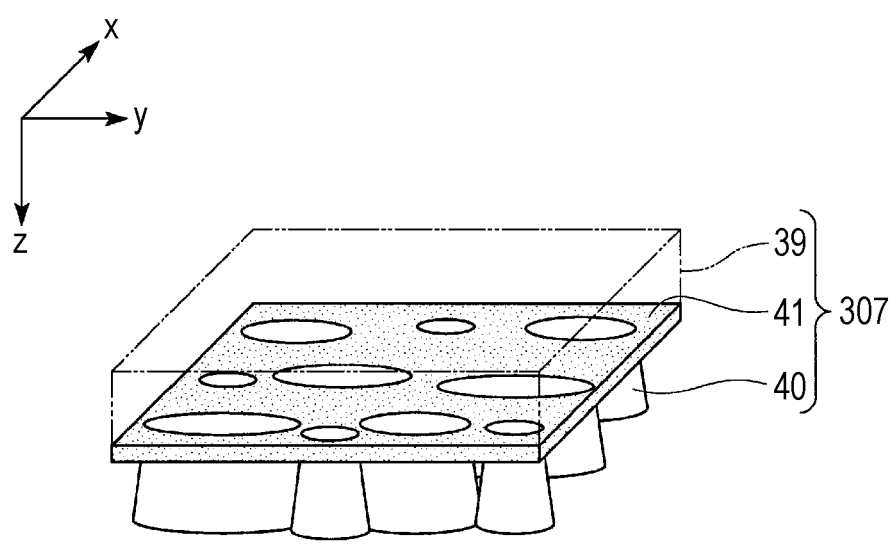
FIG. 15 is a perspective view of a light-diffusing film according to a fourth embodiment, viewed from a viewing side.

FIG. 15 is a perspective view of a light-diffusing film 307, viewed from the viewing side. FIG. 16 is a schematic diagram of the light-diffusing film 307. In FIG. 16, a diagram in an upper-left side is a plan view of the light-diffusing film 307. A diagram in a lower-left side is a sectional view taken along the C-C line indicated in the plan view in the upper-left side. A diagram in an upper-right side is a sectional view taken along the D-D line indicated in the plan view in the upper-left side.

As illustrated in FIG. 15, the light-diffusing film 307 includes the light-transmissive substrate 39, the plurality of light-diffusing portions 40, and the wavelength-controlling layer 41. The plurality of light-diffusing portions 40 are formed on one surface of the light-transmissive substrate 39 (surface opposite to the viewing side). The wavelength-controlling layer 41 is formed on the one surface of the light-transmissive substrate 39 substantially in a region other than a region where the light-diffusing portions 40 are formed.

The expression "the wavelength-controlling layer 41 formed substantially in a region other than a region where the light-diffusing portions 40 are formed" is intended to encompass a case in which the wavelength-controlling layer 41 is formed so as to partially overlap the light-diffusing portions 40.

Figure 16:
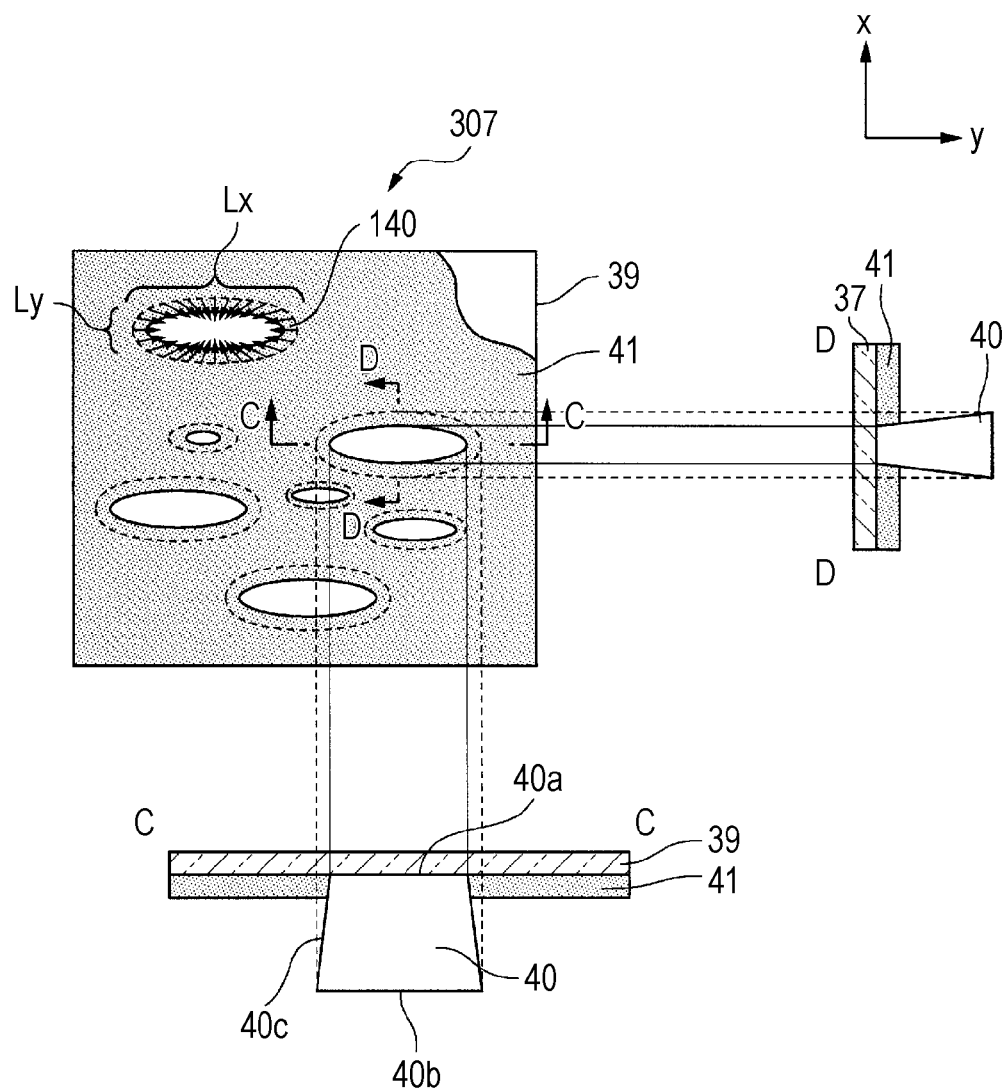
FIG. 16 is a plan view of the light-diffusing film.

As illustrated in the diagram in the upper-left side of FIG. 16, in the light-diffusing film 307 according to the present embodiment, the plurality of light-diffusing portions 40 are disposed so as to be interspersed on the one surface of the light-transmissive substrate 39. The planar shape of the light-diffusing portion 341 as viewed in the normal direction to the light-transmissive substrate 39 is an elongated ellipse. The light-diffusing portion 40 has a major axis and a minor axis.

As illustrated in the diagrams in the lower-left side and the upper-right side of FIG. 16, a portion underneath the wavelength-controlling layer 41 serves as the air-cavity 42. The air is present inside the air-cavity 42. The light-diffusing film 307 includes the continuous air-cavity 42 in which the air is present. The light-diffusing portions 40 are provided so as to be interspersed in a portion other than the air-cavity 42.

The directions of the major axes of the plurality of light-diffusing portions 40 substantially all extend in the y-direction. The directions of the minor axes of the plurality of light-diffusing portions 40 substantially all extend in the x-direction. Thus, when the orientation of the side surfaces 40c of the light-diffusing portions 40 is considered, of the side surfaces 40c of the light-diffusing portions 40, the proportion of the side surfaces 40c along the y-direction is greater than the proportion of the side surfaces 40c along the x-direction. Therefore, the amount of the light Lx that is reflected by the side surfaces 40c along the y-direction and is diffused in the x-direction is greater the amount of the light Ly that is reflected by the side surfaces 40c along the x-direction and is diffused in the y-direction. Thus, the azimuthal direction in which the diffusion property of the light-diffusing film 307 is relatively high is the x-direction, which is the minor-axis direction of the light-diffusing portions 40.

In the present embodiment, the light-diffusing film 307 is bonded to the liquid-crystal panel such that the azimuthal direction in which the diffusion property is relatively high coincides with the direction in which the viewing angle characteristics are to be improved in the liquid-crystal panel. The viewing angle characteristics of the liquid-crystal panel differ as appropriate in accordance with a display mode.

In the present embodiment as well, the wavelength-controlling layer 41 is provided, and thus similar effects to those of the above-described embodiments can be obtained. Specifically, light emitted from the liquid-crystal panel 4 is favorably diffused by the light-diffusing film 107, and a liquid-crystal display device that is capable of a bright display at a broad viewing angle can be implemented.

Although the ratio of the length of the minor axis to the length of the major axis is substantially the same among the light-diffusing portions 40 in the present embodiment, a light-diffusing portion 40 in which the ratio of the length of the minor axis to the length of the major axis is different may also be provided.

In addition, although the light-diffusing portions 40 are disposed such that their major axes extend in the same direction in the present embodiment, the plurality of light-diffusing portions 40 may be disposed such that the major axes of some of the light-diffusing portions 40 extend in a direction different from the direction in which the major axes of the other light-diffusing portions 40 extend.

In addition, although the plurality of light-diffusing portions 40 are all disposed so as to be interspersed in the present embodiment, some of the plurality of light-diffusing portions 40 may be connected to some other light-diffusing portions 40.

In addition, although the plurality of light-diffusing portions 40 all have an elliptical shape in the present embodiment, some of the plurality of light-diffusing portions 40 may have another shape, such as a rectangular shape.

(Fifth Embodiment)

Hereinafter, a fifth embodiment of the present invention will be described with reference to FIG. 17.

The basic configuration of a liquid-crystal display device according to the present embodiment is identical to that of the first embodiment, and only the configuration of a light-diffusing film differs from that of the first embodiment. Therefore, the description of the basic configuration of the liquid-crystal display device is omitted, and only the light-diffusing film will be described in the present embodiment.

Figure 17:
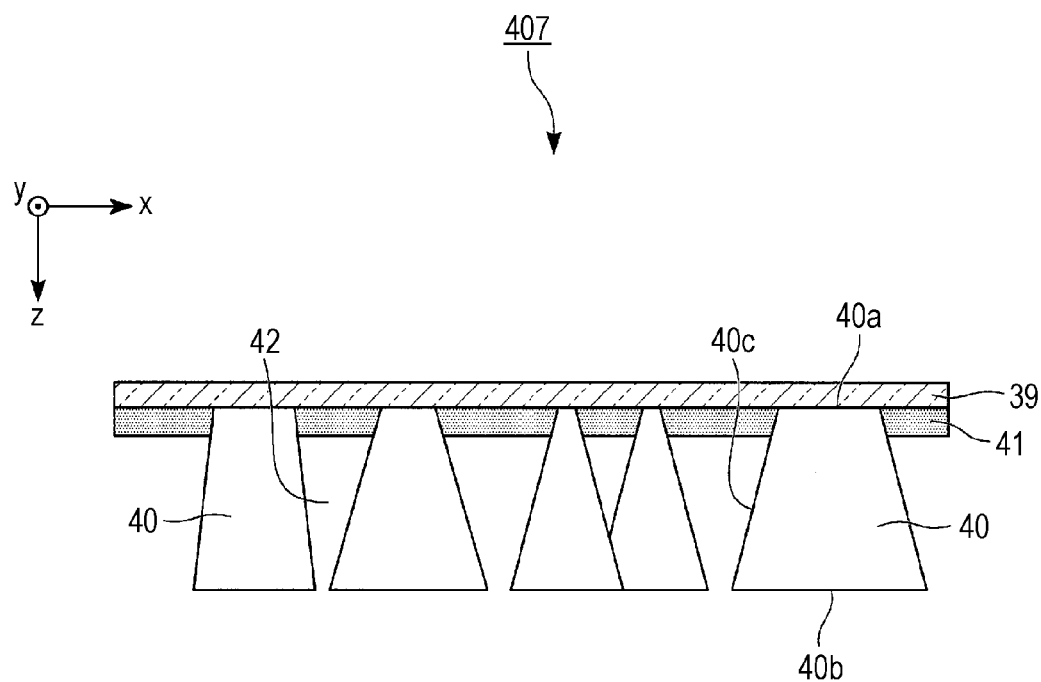
FIG. 17 is a sectional view of a light-diffusing film according to a fifth embodiment.

FIG. 17 is a sectional view of a light-diffusing film 407 according to the fifth embodiment.

In the first embodiment described above, the angles of inclination of the side surfaces 40c (reflective surfaces) of the plurality of light-diffusing portions 40 are the same. In the meantime, as illustrated in FIG. 17, in the light-diffusing film 407 according to the present embodiment, the angles of inclination of the side surfaces 40c of the plurality of light-diffusing portions 40 are different from one another. In other words, when looking at the plurality of light-diffusing portions 40 as a whole, the light-emitting end-surfaces 40a of the plurality of light-diffusing portions 40 have a variety of sizes, and the side surfaces 40c of the plurality of light-diffusing portions 40 have a variety of angles of inclination. As the angles of inclination of the side surfaces 40c of the plurality of light-diffusing portions 40 are different from one another, the sizes of the light-incident end-surfaces 40b are also different from one another.

In the present embodiment as well, the wavelength-controlling layer 41 is provided, and thus similar effects to those of the above-described embodiments can be obtained. Specifically, light emitted from the liquid-crystal panel 4 is favorably diffused by the light-diffusing film 407, and a liquid-crystal display device that is capable of a bright display at a broad viewing angle can be implemented.

(Sixth Embodiment)

Hereinafter, a sixth embodiment of the present invention will be described with reference to FIG. 18A and FIG. 18B.

The basic configuration of a liquid-crystal display device according to the present embodiment is identical to that of the first embodiment, and only the configuration of a light-diffusing film differs from that of the first embodiment. Therefore, the description of the basic configuration of the liquid-crystal display device is omitted, and only the light-diffusing film will be described in the present embodiment.

Figure 18A:
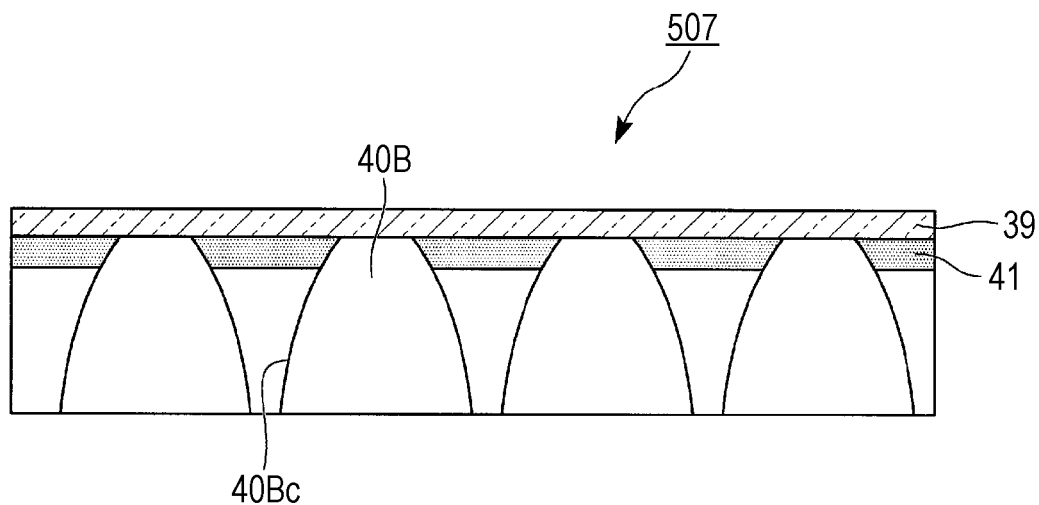
FIG. 18A is a sectional view of a light-diffusing film according to a sixth embodiment.
Figure 18B:
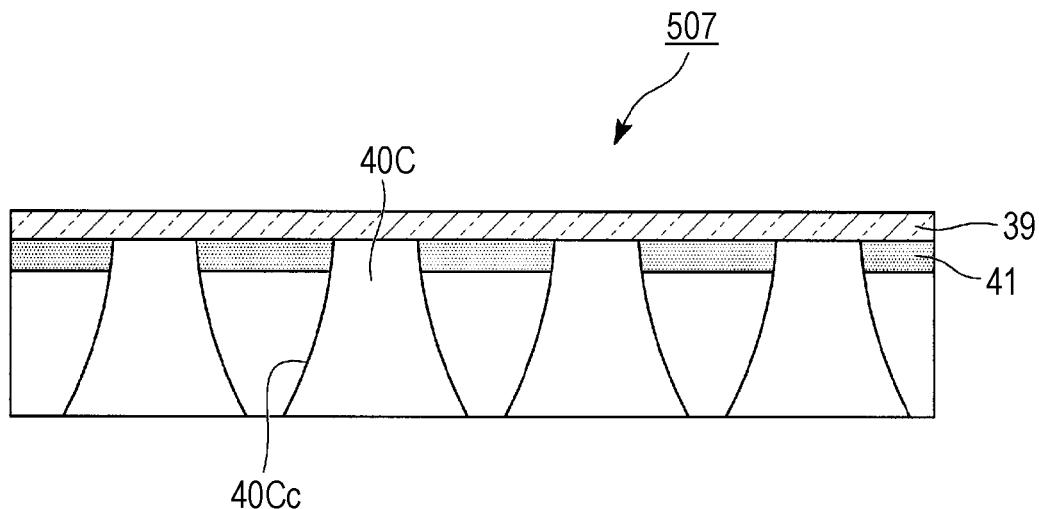
FIG. 18B is another sectional view of a light-diffusing film according to the sixth embodiment.

FIG. 18A and FIG. 18B are sectional views of a light-diffusing film 507 according to the sixth embodiment.

In the first embodiment described above, the angle of inclination of the side surface 40c of the light-diffusing portion 40 is constant.

In the meantime, as illustrated in FIG. 18A and FIG. 18B, the angles of inclination of side surfaces 40Bc and 40Cc of respective light-diffusing portions 40B and 40C of the light-diffusing film 507 according to the present embodiment vary depending on the position. Specifically, the angles of inclination of the side surfaces 40Bc and 40Cc of the respective light-diffusing portions 40B and 40C according to the present embodiment vary continuously.

In the light-diffusing film 507 illustrated in FIG. 18A, the side surface 40Bc of the light-diffusing portion 40B is curved outwardly.

In the light-diffusing film 507 illustrated in FIG. 18B, the side surface 40Cc of the light-diffusing portion 40C is curved inwardly.

With the configuration according to the present embodiment, in addition to the effect of the first embodiment described above, the light-diffusing property can further be increased.

(Seventh Embodiment)

Hereinafter, a seventh embodiment of the present invention will be described with reference to FIG. 19A and FIG. 19B.

The basic configuration of a liquid-crystal display device according to the present embodiment is identical to that of the first embodiment, and only the configuration of a light-diffusing film differs from that of the first embodiment. Therefore, the description of the basic configuration of the liquid-crystal display device is omitted, and only the light-diffusing film will be described in the present embodiment.

Figure 19A:
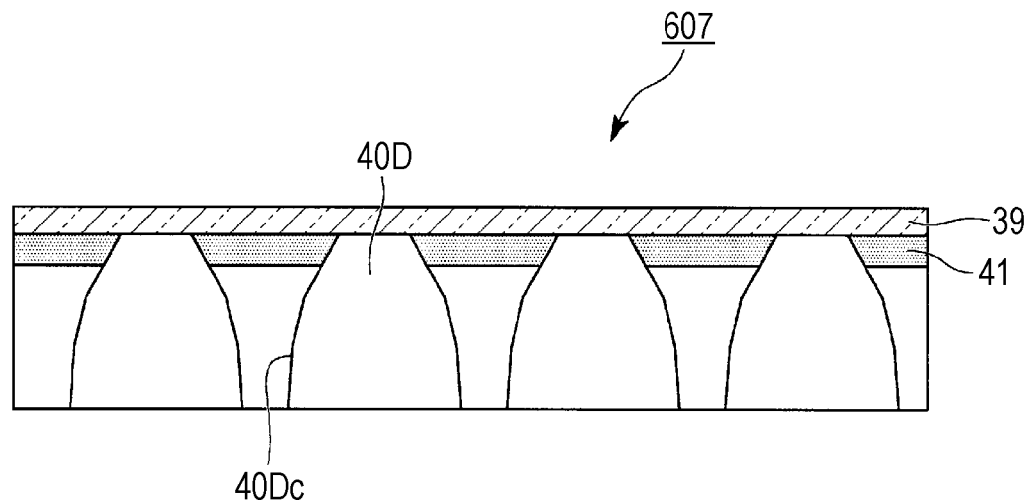
FIG. 19A is a sectional view of a light-diffusing film according to a seventh embodiment.
Figure 19B:
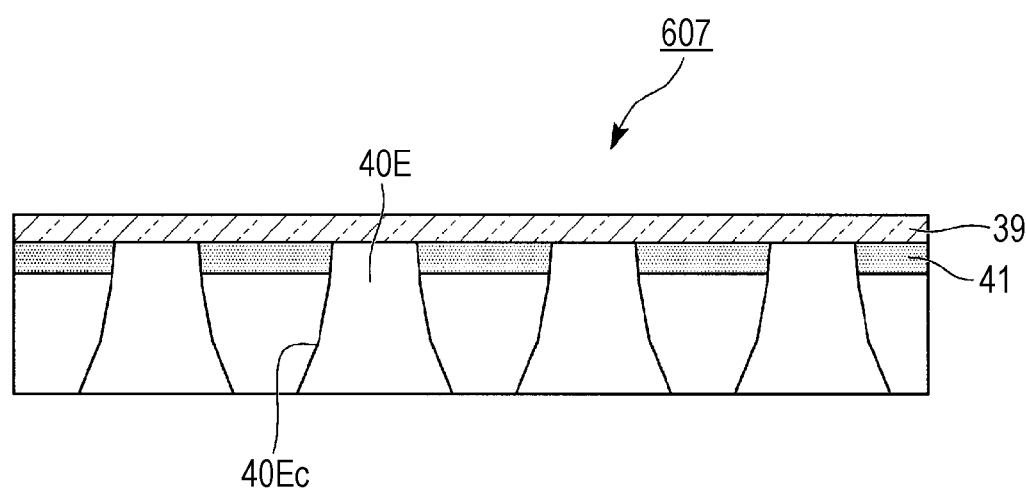
FIG. 19B is another sectional view of a light-diffusing film according to the seventh embodiment.

FIG. 19A and FIG. 19B are sectional views of a light-diffusing film 607 according to the seventh embodiment.

In the first embodiment described above, the angle of inclination of the side surface 40c of the light-diffusing portion 40 is constant.

In the meantime, as illustrated in FIG. 19A and FIG. 19B, the angles of inclination of side surfaces 40Dc and 40Ec of respective light-diffusing portions 40D and 40E of the light-diffusing film 607 according to the present embodiment vary depending on the position. Specifically, the side surfaces 40Dc and 40Ec of the respective light-diffusing portions 40D and 40E according to the present embodiment have a plurality of different angles of inclination (inclined surface whose sectional shape is polygonal.

In the light-diffusing film 607 illustrated in FIG. 19A, the side surface 40Dc of the light-diffusing portion 40D has three inclined surfaces with different angles of inclination and protrudes outwardly.

In the light-diffusing film 607 illustrated in FIG. 19B, the side surface 40Ec of the light-diffusing portion 40E has three inclined surfaces with different angles of inclination and protrudes inwardly.

With the configuration according to the present embodiment, in addition to the effect of the first embodiment described above, light-diffusing property can further be increased.

(Eighth Embodiment)

Hereinafter, an eighth embodiment of the present invention will be described with reference to FIG. 20.

The basic configuration of a liquid-crystal display device according to the present embodiment is identical to that of the first embodiment, but differs from that of the first embodiment in that a refractive-index-adjusting layer is provided in the light-diffusing film. Therefore, the description of the basic configuration of the liquid-crystal display device is omitted, and only the light-diffusing film will be described in the present embodiment.

Figure 20:
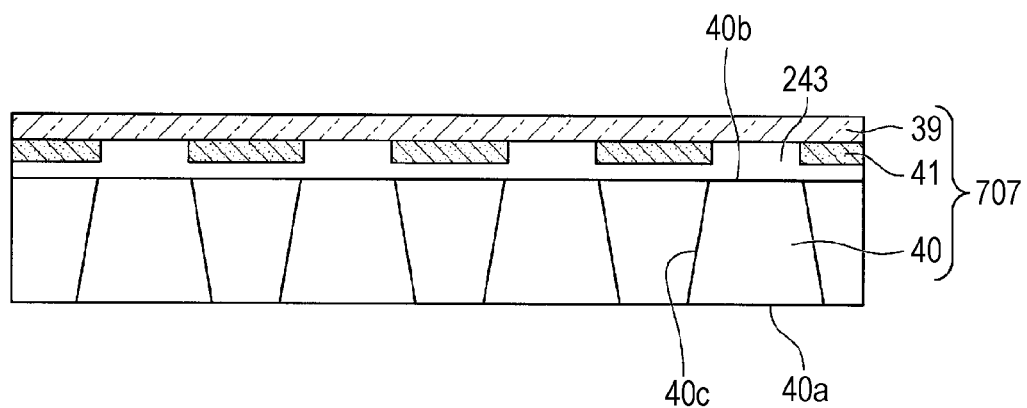
FIG. 20 is a sectional view of a light-diffusing film according to an eighth embodiment.

FIG. 20 is a sectional view of a light-diffusing film 707.

In the present embodiment, a refractive-index-adjusting layer 243 is formed on an entire surface of one side of the light-transmissive substrate 39 so as to cover the wavelength-controlling layer 41. The refractive-index-adjusting layer 243 is formed, for example, of an organic material having a light-transmitting property, such as an acrylic resin and an epoxy resin. In one example of the present embodiment, the refractive-index-adjusting layer 243 is formed of an acrylic resin having a refractive index of 1.57. The refractive index of the refractive-index-adjusting layer 243 is set to be smaller than the refractive index of the light-transmissive substrate 239 and is larger than the refractive index of the light-diffusing portion 240 and the refractive index of the second polarization plate 5. In other words, the refractive-index-adjusting layer 243 having a refractive index that lies between the refractive index of the second polarization plate 5 and the refractive index of the light-transmissive substrate 39 is provided between the second polarization plate 5 and the light-transmissive substrate 39.

The refractive-index-adjusting layer 243 may be formed of a single kind of material, or may be formed of two or more kinds of materials having different refractive indices so that the refractive indices are set to satisfy the aforementioned relationship. The refractive-index-adjusting layer 243 covers the wavelength-controlling layer 41 and has a planar surface (surface opposite to the light-transmissive substrate 39).

Figure 21A:
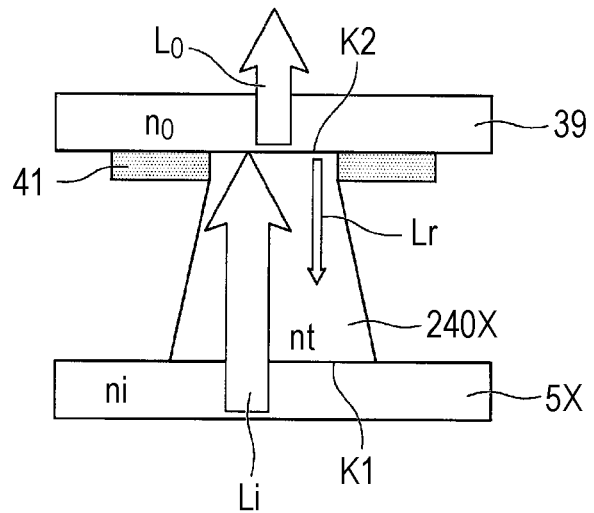
FIG. 21A is an illustration for describing a function of the light-diffusing film according to the eighth embodiment.

Hereinafter, a function of the light-diffusing film 707 according to the present embodiment will be described with reference to FIG. 21A and FIG. 21B.

Here, a liquid-crystal display device of a comparative example that does not include the refractive-index-adjusting layer 243 will be considered. The liquid-crystal display device of the comparative example has the same configuration as the display device according to the present embodiment except that the refractive-index-adjusting layer 243 is not provided. In that case, as illustrated in FIG. 21A, in the liquid-crystal display device of the comparative example, light Li emitted from the liquid-crystal panel passes through a second polarization plate 5X, a light-diffusing portion 240X, and the light-transmissive substrate 39 in this order and is emitted toward the viewer side. The refractive index ni of the second polarization plate 5X is 1.50, and the refractive index nt of the light-diffusing portion 240X is 1.50. Thus, interface reflection does not occur at an interface K1 between the second polarization plate 5X and the light-diffusing portion 240X. However, the refractive index nt of the light-diffusing portion 240X is 1.50, and the refractive index no of the light-transmissive substrate 39 is 1.65. Thus, interface reflection occurs at an interface K2 between the light-diffusing portion 240X and the light-transmissive substrate 39, and the transmittance of the light decreases.

According to a simulation by the present inventor, of the light incident normally on the interface K2 between the light-diffusing portion 240X and the light-transmissive substrate 39, 0.23% or light Lr undergoes interface reflection. Consequently, the transmittance of light Lo is reduced to 99.77%.

Figure 21B:
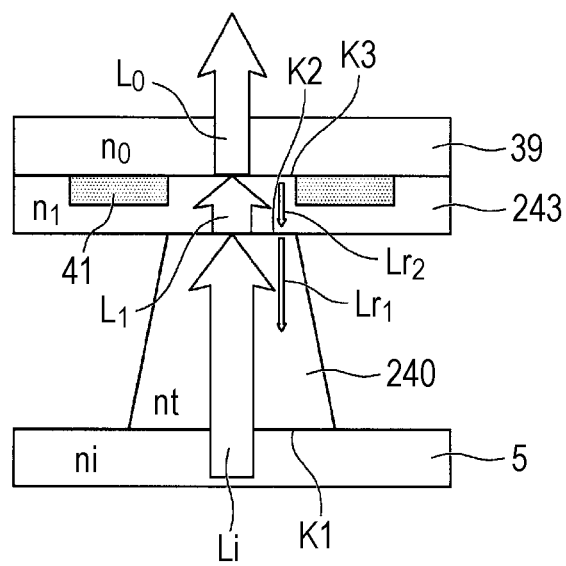
FIG. 21B is another illustration for describing a function of the light-diffusing film according to the eighth embodiment.

In the meantime, in the present embodiment, as illustrated in FIG. 21B, the light Li emitted from the liquid-crystal panel 4 passes through the second polarization plate 5, the light-diffusing portion 240, the refractive-index-adjusting layer 243, and the light-transmissive substrate 39 in this order and is emitted toward the viewer side. The refractive index ni of the second polarization plate 5 is 1.50, and the refractive index nt of the light-diffusing portion 240 is 1.50. Thus, interface reflection does not occur at the interface K1 between the second polarization plate 5 and the light-diffusing portion 240. The refractive index nt of the light-diffusing portion 240 is 1.50, and the refractive index n1 of the refractive-index-adjusting layer 243 is 1.57. Thus, slight interface reflection occurs at the interface K2 between the light-diffusing portion 240 and the refractive-index-adjusting layer 243. The refractive index n1 of the refractive-index-adjusting layer 243 is 1.57, and the refractive index no of the light-transmissive substrate 39 is 1.65. Thus, slight interface reflection occurs at an interface K3 between refractive-index-adjusting layer 243 and the light-transmissive substrate 39.

According to a simulation by the present inventor, of the light incident normally on the interface K2 between the light-diffusing portion 240 and the refractive-index-adjusting layer 243, 0.06% or light Lr1 undergoes interface reflection. In a similar manner, of the light L1 incident normally on the interface K3 between the refractive-index-adjusting layer 243 and the light-transmissive substrate 39, 0.06% or light Lr2 undergoes interface reflection. Consequently, the transmittance of the light Lo is 99.89%, which is higher than that of the comparative example.

With the light-diffusing film 707 according to the present embodiment, the refractive-index-adjusting layer 243 having a refractive index that lies between the refractive index of the second polarization plate 5 and the refractive index of the light-transmissive substrate 39 is interposed between the light-transmissive substrate 39 and the light-diffusing portion 240 so as to reduce the difference in the refractive index at the interfaces, and thus interface reflection can be reduced. As illustrated in FIGS. 21A and 21B, there is one interface at which interface reflection occurs in the comparative example, and there are two interfaces at which interface reflection occurs in the present embodiment. However, the total quantity of reflected light according to the present embodiment is less than that of the comparative example. Accordingly, the transmittance of light increases, and a liquid-crystal display device that is capable of a bright display can be implemented.

(Ninth Embodiment)

Hereinafter, a ninth embodiment of the present invention will be described with reference to FIG. 22A and FIG. 22B.

The basic configuration of a liquid-crystal display device according to the present embodiment is identical to that of the first embodiment, but differs from that of the first embodiment in that a light-scattering portion is provided in the light-diffusing film. Therefore, the description of the basic configuration of the liquid-crystal display device is omitted, and only the light-diffusing film will be described in the present embodiment.

Figure 22A:
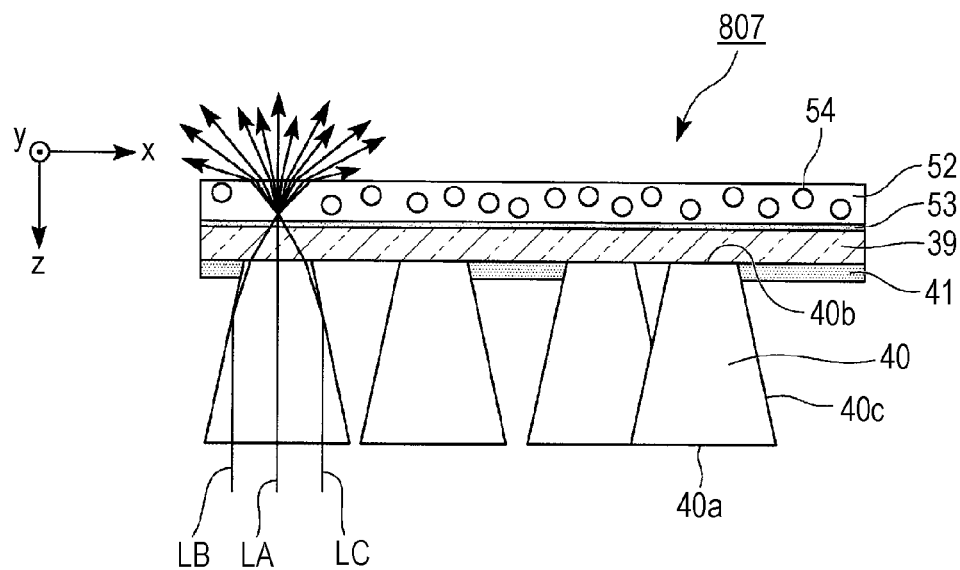
FIG. 22A is a sectional view of a light-diffusing film according to a ninth embodiment.
Figure 22B:
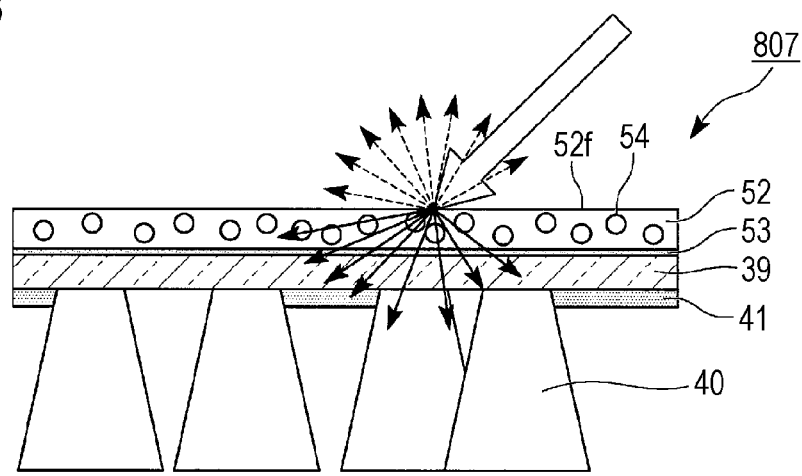
FIG. 22B is another sectional view of a light-diffusing film according to the ninth embodiment.

FIG. 22A and FIG. 22B are sectional views of a light-diffusing film 807.

As illustrated in FIG. 22A and FIG. 22B, in the light-diffusing film 807 according to the present embodiment, a scattering film 52 (light-scattering layer) is fixed to a viewing-side surface of the light-transmissive substrate 39 with an adhesive layer 53. The scattering film 52 is a film in which, for example, a number of light-scattering bodies 54, such as acrylic beads, are dispersed inside a binder resin, such as an acrylic resin. The scattering film 52 has a thickness of approximately 20 µm, for example. A spherical light-scattering body 54 has a diameter of approximately 0.5 to 20 µm, for example. The adhesive layer 53 has a thickness of approximately 25 µm, for example. The scattering film 52 functions as an isotropic scattering material. In other words, the scattering film 52 serves a function of isotropically scattering light whose angle of emission has been controlled by the light-diffusing portion 40 and further broadening the angle.

The light-scattering body 54 may be formed not only of an acrylic bead but also of a resin piece made of an acrylic polymer, an olefin-based polymer, a vinyl-based polymer, a cellulose-based polymer, an amide-based polymer, a fluorine-based polymer, a urethane-based polymer, a silicone-based polymer, an imide-based polymer, or the like, or of a transparent substance, such as a glass bead. In addition, aside from such transparent substances, a scattering member or reflective member that does not absorb light can be used. Alternatively, the light-scattering bodies 54 may be constituted by air bubbles dispersed inside the light-diffusing portion 40. Individual light-scattering bodies 54 may, for example, be formed into a variety of shapes, such as a sphere, an ellipsoid, a plate-shape, and a polyhedron. The sizes of the light-scattering bodies 54 may be the same or may be different.

In the present embodiment, the scattering film 52 also serves as an antiglare treatment layer (antiglare layer). The antiglare treatment layer can be formed, for example, by subjecting the light-transmissive substrate 39 to a sandblasting treatment or an embossing treatment. However, in the present embodiment, the antiglare treatment is carried out by bonding the scattering film 52 that includes the plurality of light-scattering bodies 54 on one surface of the light-transmissive substrate 39. With this configuration, the scattering film 52 functions as the antiglare treatment layer, and thus a separate antiglare treatment layer does not need to be provided. Thus, the device can be simplified and can be reduced in thickness.

Although the scattering film 52 is provided outside the adhesive layer 53 in the present embodiment, the present embodiment is not limited to this configuration. For example, the adhesive layer 53 itself may have a light-scattering property. This configuration can be implemented, for example, by dispersing a number of light-scattering bodies in the adhesive layer 53. The adhesive layer 53 can be made of an adhesive substance suitable for a bonding target, such as an adhesive that is rubber-based, acrylic-based, silicone-based, vinyl alkyl ether-based, polyvinyl alcohol-based, polyvinylpyrrolidone-based, polyacrylamide-based, or cellulose-based. In particular, an adhesive substance that excels in transparency and weatherability is preferably used. It is preferable that the adhesive layer 53 be protected by a separator or the like until the adhesive layer 53 is put to use.

As illustrated in FIG. 22A, in the case of the light-diffusing film 807 according to the present embodiment, the scattering film 52 is disposed on the outermost surface of the light-diffusing film 807. Therefore, light rays LA, LB, and LC incident on the light-incident end-surface 40b of the light-diffusing portion 40 have their angles of emission controlled by the light-diffusing portion 40 and are then isotropically scattered by the scattering film 52. Consequently, light rays are emitted from the scattering film 52 at various angles.

Meanwhile, as illustrated in FIG. 22B, the scattering film 52 is configured such that light incident on the upper surface of the scattering film 52 (surface 52f opposite to the light-diffusing portion 40) and reflected by an interface between the light-transmissive substrate, such as a binder resin, and the light-scattering body 54 or refracted by the light-scattering body 54 so as to have its traveling direction changed is scattered forwardly. In FIG. 22B, forward-scattered light is indicated by solid arrows. For comparison, back-scattered light is indicated by broken arrows, but this kind of light is prevented from occurring. Such a total reflection condition can be satisfied, for example, by changing, as appropriate, the size of the particles in the light-scattering bodies 54 included in the scattering film 52.

According to the present embodiment, in addition to the effects of the first embodiment described above, a display with higher luminance and higher contrast can be obtained. In addition, in the present embodiment, the scattering film 52 is disposed on the outermost surface of the light-diffusing film 807, and thus the angles at which the light is diffused can be prevented from concentrating on any one direction. Consequently, the light-diffusing film 807 can have more gradual light-diffusing characteristics and can achieve a bright display with a broad viewing angle.

Figure 23A:
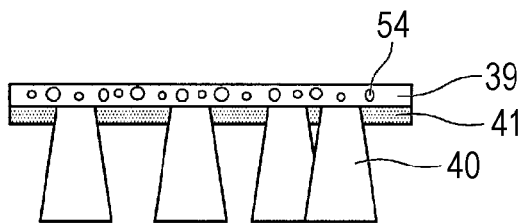
FIG. 23A is a sectional view illustrating another configuration mode of a light-diffusing film according to the ninth embodiment.
Figure 23B:
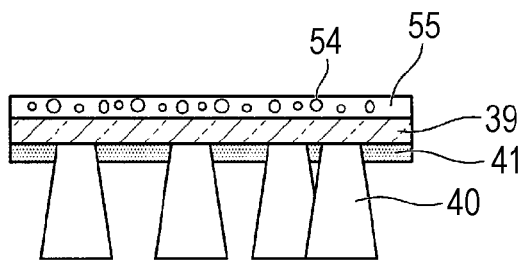
FIG. 23B is another sectional view illustrating the other configuration mode of the light-diffusing film according to the ninth embodiment.
Figure 23C:
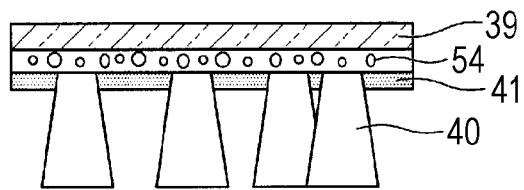
FIG. 23C is yet another sectional view illustrating the other configuration mode of the light-diffusing film according to the ninth embodiment.
Figure 23D:
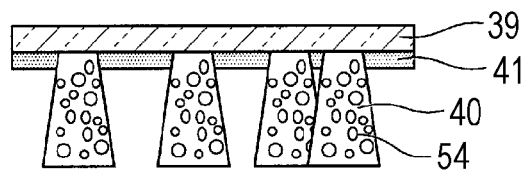
FIG. 23D is yet another sectional view illustrating the other configuration mode of the light-diffusing film according to the ninth embodiment.
Figure 23E:
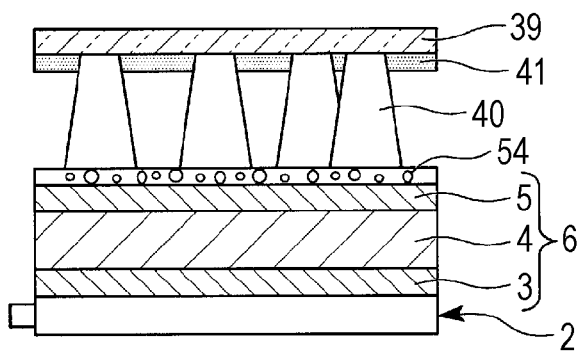
FIG. 23E is yet another sectional view illustrating the other configuration mode of the light-diffusing film according to the ninth embodiment.

Although a case in which the scattering film 52 is provided on the viewing side surface of the light-transmissive substrate 39 is illustrated in the ninth embodiment above, the configuration is not limited thereto. For example, as illustrated in FIG. 23A, the light-scattering bodies 54 may be provided in the light-transmissive substrate 39, and the light-transmissive substrate 39 itself may be made to function as the light-scattering layer. Alternatively, as illustrated in FIG. 23B, the light-scattering bodies 54 may be provided in a hard-coat layer (protective layer) 55 that is provided on the viewing side surface of the light-transmissive substrate 39, and the hard-coat layer 55 itself may be made to function as the light-scattering layer. Alternatively, as illustrated in FIG. 23C, the scattering film 52 may be disposed between the light-transmissive substrate 39 and the light-diffusing portion 40. Alternatively, as illustrated in FIG. 23D, the light-scattering bodies 54 may be provided inside the light-diffusing portion 40. Alternatively, as illustrated in FIG. 23E, the light-scattering bodies 54 may be provided inside a bonding layer 56 that affixes (bonds) the light-diffusing film 807 to the liquid-crystal display unit 6, and the bonding layer 56 itself may be made to function as the light-scattering layer. Furthermore, at least two or more among the configurations illustrated in FIG. 23A to FIG. 23E may be combined.

It is to be noted that the technical scope of the present invention is not limited to the above-described embodiments, and various modifications can be made within the scope that does not depart from the spirit of the present invention.

For example, although the wavelength-controlling layers 41 and 141 that function as light-shielding layers as the ultraviolet absorber is contained in a black black resist are illustrated in the embodiments described above, the wavelength-controlling layer according to the present invention does not need to function as a light-shielding layer. For example, if the light-diffusing film is to be used in a liquid-crystal display device that is used in an environment where there is little influence of outside light, a wavelength-controlling layer in which an ultraviolet absorber is added to a resin material having a high light-transmitting property (without a light-shielding property) in a visible-light range may be used. Alternatively, a configuration may be such that the wavelength-controlling layer is colored in a color other than black (e.g., blue, red, yellow, etc.).

INDUSTRIAL APPLICABILITY

The present invention can be used in a variety of display devices including a liquid-crystal display device, an organic electroluminescent display device, a plasma display, an LED display, and a MEMS display.

REFERENCE SIGNS LIST

1 LIQUID-CRYSTAL DISPLAY DEVICE (DISPLAY DEVICE)
4 LIQUID-CRYSTAL PANEL (DISPLAY UNIT)
7, 107, 207, 307, 407, 507, 607, 707, 807 LIGHT-DIFFUSING FILM (LIGHT-DIFFUSING MEMBER)
39 LIGHT-TRANSMISSIVE SUBSTRATE
40, 141 LIGHT-DIFFUSING PORTION
41, 141 WAVELENGTH-CONTROLLING LAYER
40*a* LIGHT-EMITTING END-SURFACE
40*b* LIGHT-INCIDENT END-SURFACE

The invention claimed is:

1. A light-diffusing member, comprising:
a light-transmissive substrate;
a plurality of wavelength-controlling layers defined on one surface of the light-transmissive substrate; and
a light-diffusing portion that is continuously provided on the one surface of the light-transmissive substrate, the plurality of wavelength-controlling layers being provided in a region other than a formation region of the light-diffusing portion, wherein
the light-diffusing portion includes a light-emitting end-surface that makes contact with the one surface of the light-transmissive substrate and a light-incident end-surface that is opposite to the light-emitting end-surface and that has an area greater than an area of the light-emitting end-surface, and includes a photosensitive resin,
a plurality of openings are provided in plane with the light-incident end-surface and opposite to the plurality of wavelength-controlling layers, and an area of each of the plurality of openings is less than an area of each of the plurality of wavelength-controlling layers,
a height of the light-diffusing portion from the light-incident end-surface to the light-emitting end-surface is greater than a thickness of the plurality of wavelength-controlling layers,
the plurality of wavelength-controlling layers have characteristics that an optical absorptance at a first wavelength in an ultraviolet wavelength band is higher than an optical absorptance at a second wavelength in a visible-light wavelength band, and
the plurality of wavelength-controlling layers have a point of inflection around a boundary between ultraviolet radiation and visible light and have characteristics such that optical transmittance increases at the point of inflection.

2. The light-diffusing member according to claim 1, wherein the plurality of wavelength-controlling layers include a resin material that contains an ultraviolet absorptive substance that absorbs ultraviolet radiation.

3. The light-diffusing member according to claim 2, wherein the resin material is colored in black.

4. The light-diffusing member according to claim 1,
wherein the first wavelength band includes 365 nm, which is a photosensitive wavelength of the photosensitive resin, and the second wavelength band includes 555 nm, at which photopic spectral luminous efficiency is at a maximum, and
wherein the first transmittance at the 365 nm is no greater than one-hundredth the second transmittance at the 555 nm.

5. A light-diffusing member, comprising:
a light-transmissive substrate;
a plurality of light-diffusing portions that is provided on one surface of the light-transmissive substrate; and
a wavelength-controlling layer that is continuously provided on the one surface of the light-transmissive substrate in a region other than a formation region of the light-diffusing portions,
wherein the plurality of light-diffusing portions include a light-emitting end-surface that makes contact with the one surface of the light-transmissive substrate and a light-incident end-surface that is opposite to the light-emitting end-surface and that has an area greater than an area of the light-emitting end-surface, and includes a photosensitive resin that is defined by an exposed negative resist, wherein
a height of the plurality of light-diffusing portions from the light-incident end-surface to the light-emitting end-surface is greater than a thickness of the wavelength-controlling layer,
the wavelength-controlling layer has characteristics that an optical absorptance at a first wavelength in an ultraviolet wavelength band is higher than an optical absorptance at a second wavelength in a visible-light wavelength band, and
the wavelength-controlling layer has a point of inflection around a boundary between ultraviolet radiation and visible light and has characteristics such that optical transmittance increases at the point of inflection.

* * * * *